(12) United States Patent
Morimoto et al.

(10) Patent No.: US 9,069,046 B2
(45) Date of Patent: Jun. 30, 2015

(54) DETERIORATION STATE ESTIMATION APPARATUS AND DETERIORATION STATE ESTIMATION METHOD FOR SECONDARY BATTERY

(75) Inventors: Shinichi Morimoto, Kariya (JP); Teruo Ishishita, Miyoshi (JP); Masaru Kimura, Toyota (JP); Takashi Ogura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 11 days.

(21) Appl. No.: 14/236,846

(22) PCT Filed: Aug. 3, 2011

(86) PCT No.: PCT/JP2011/004404
§ 371 (c)(1),
(2), (4) Date: Feb. 3, 2014

(87) PCT Pub. No.: WO2013/018143
PCT Pub. Date: Feb. 7, 2013

(65) Prior Publication Data
US 2014/0159736 A1    Jun. 12, 2014

(51) Int. Cl.
*G01N 27/416* (2006.01)
*G01R 31/36* (2006.01)

(52) U.S. Cl.
CPC ........ *G01R 31/3627* (2013.01); *G01R 31/3679* (2013.01); *G01R 31/3606* (2013.01); *G01R 31/3662* (2013.01)

(58) Field of Classification Search
CPC .................................................... G01R 31/3662
USPC .......................................................... 324/430
See application file for complete search history.

(56) References Cited

U.S. PATENT DOCUMENTS 4,045,721 A * 8/1977 Swain ............................ 320/137
2013/0162258 A1 * 6/2013 Patin et al. ..................... 324/427

* cited by examiner

*Primary Examiner* — Edward Tso
*Assistant Examiner* — Ahmed Omar
(74) *Attorney, Agent, or Firm* — Oliff PLC

(57) ABSTRACT

An estimation apparatus of estimating a deterioration state of a secondary battery has a current sensor measuring an electric current of the secondary battery, a current estimating section estimating the electric current of the secondary battery by using a battery model, and a deterioration estimating section estimating a second deterioration component produced in association with a salt concentration imbalance in the secondary battery. The deterioration estimating section estimates the second deterioration component by using the measured current obtained from the current sensor, the estimated current obtained from the current estimating section, and a first deterioration component produced in association with wear of the secondary battery. The deterioration estimating section corrects the estimated current by using a ratio between a resistance change rate of the secondary battery when the second deterioration component is eliminated and a resistance change rate during charge and discharge of the secondary battery.

12 Claims, 18 Drawing Sheets

FIG. 5

| | |
|---|---|
| $C_{ej}$ | LITHIUM ION CONCENTRATION IN ELECTROLYTIC SOLUTION |
| $C_{sj}$ | LITHIUM ION CONCENTRATION IN ACTIVE MATERIAL |
| $C_{sj,max}$ | MAXIMUM LITHIUM ION CONCENTRATION |
| $C_{sej}$ | LITHIUM ION CONCENTRATION AT ACTIVE MATERIAL INTERFACE |
| $\phi_{ej}$ | POTENTIAL OF ELECTROLYTIC SOLUTION |
| $\phi_{sj}$ | POTENTIAL OF ACTIVE MATERIAL |
| $T$ | ABSOLUTE TEMPERATURE |
| $J_j^{Li}$ | LITHIUM ION PRODUCTION AMOUNT IN UNIT VOLUME AND UNIT TIME (REACTION CURRENT DENSITY) $I = \int j_j^{Li} dv$ |
| $\alpha_{sj}$ | TRANSFER COEFFICIENT IN ELECTRODE REACTION $J_j^{Li}$ (OXIDATION REACTION) |
| $\alpha_{cj}$ | TRANSFER COEFFICIENT IN ELECTRODE REACTION $J_j^{Li}$ (REDUCTION REACTION) $\alpha_{sj} + \alpha_{cj} = 1$ |
| $F$ | FARADAY'S CONSTANT |
| $i_{0j}$ | EXCHANGE CURRENT DENSITY |
| $\eta_j$ | OVERVOLTAGE IN ELECTRODE REACTION $J_j^{Li}$ |
| $U_j$ | OPEN CIRCUIT VOLTAGE (OCV) |
| $\theta_j$ | LOCAL SOC AT ACTIVE MATERIAL INTERFACE $\theta_j = \dfrac{C_{sej}}{C_{sj,max}}$ |
| $R_f$ | FILM RESISTANCE OF ELECTRODE SURFACE |
| $t_+^0$ | TRANSFERENCE NUMBER OF LITHIUM ION |
| $D_{sj}$ | DIFFUSION COEFFICIENT OF ACTIVE MATERIAL |
| $D_{ej}^{eff}$ | EFFECTIVE DIFFUSION COEFFICIENT OF ELECTROLYTIC SOLUTION |
| $a_{sj}$ | SURFACE AREA OF ACTIVE MATERIAL PER UNIT VOLUME OF ELECTRODE |
| $r_{sj}$ | RADIUS OF ACTIVE MATERIAL |
| $\varepsilon_{sj}$ | VOLUME FRACTION (ACTIVE MATERIAL) $\varepsilon_s + \varepsilon_e + \varepsilon_p + \varepsilon_f = 1$ |
| $\varepsilon_{ej}$ | VOLUME FRACTION (ELECTROLYTIC SOLUTION) |
| $K_j^{eff}$ | EFFECTIVE ION CONDUCTIVITY OF ELECTROLYTIC SOLUTION |
| $K_{Dj}^{eff}$ | DIFFUSION CONDUCTIVITY OF ELECTROLYTIC SOLUTION |
| $\sigma_j^{eff}$ | EFFECTIVE CONDUCTIVITY OF ACTIVE MATERIAL |
| $I$ | CURRENT DENSITY (PER UNIT SURFACE AREA OF ELECTRODE PLATE) |
| $L_j$ | THICKNESS OF ELECTRODE |

DETERIORATION STATE ESTIMATION APPARATUS AND DETERIORATION STATE ESTIMATION METHOD FOR SECONDARY BATTERY

TECHNICAL FIELD

The present invention relates to an estimation apparatus and an estimation method for estimating a deterioration state of a secondary battery, and more particularly, a deterioration component produced in association with a salt concentration imbalance.

BACKGROUND ART

A deterioration states of a secondary battery includes a deterioration component produced by wear of the secondary battery (referred to as a wear deterioration component) and a deterioration component produced by a salt concentration imbalance in the secondary battery (referred to as a high-rate deterioration component). Patent Document 1 has described a technology in which the production of the high-rate deterioration component is detected on the basis of a difference between an electric current measured with a current sensor and an electric current estimated with a battery model.

PRIOR ART DOCUMENT

Patent Document

[Patent Document 1] Japanese Patent Laid-Open No. 2010-060406

DISCLOSURE OF THE INVENTION

Problems to be Solved by the Invention

The high-rate deterioration component is produced by a salt concentration imbalance. For example, when charge and discharge of the secondary battery are continuously prohibited, the salt concentration imbalance may be eliminated. Since the high-rate deterioration component is eliminated on predetermined conditions, the estimation of the high-rate deterioration component needs to be performed in view of that fact.

Means for Solving the Problems

According to a first aspect, the present invention provides an estimation apparatus of estimating a deterioration state of a secondary battery, including a current sensor measuring an electric current of the secondary battery, a current estimating section estimating the electric current of the secondary battery by using a battery model, and a deterioration estimating section estimating a second deterioration component produced in association with a salt concentration imbalance in the secondary battery. The deterioration estimating section estimates the second deterioration component by using the measured current obtained from the current sensor, the estimated current obtained from the current estimating section, and a first deterioration component produced in association with wear of the secondary battery. The deterioration estimating section corrects the estimated current by using a ratio between a resistance change rate of the secondary battery when the second deterioration component is eliminated and a resistance change rate during charge and discharge of the secondary battery.

It can be determined that the second deterioration component is eliminated when a time for which charge and discharge of the secondary battery are prohibited is greater than a threshold value. The second deterioration component is produced in association with the salt concentration imbalance. The salt concentration imbalance can be dispersed by continuously prohibiting the charge and discharge of the secondary battery. Thus, when the time for which the charge and discharge of the secondary battery are prohibited is greater than the threshold value, it can be determined that the second deterioration component is eliminated.

It can be determined that the second deterioration component is eliminated when the second deterioration component is less than a threshold value. The elimination of the second deterioration component can be determined by monitoring the second deterioration component. The salt concentration imbalance is eliminated not only by the elapse of time but also by other factors. For example, even when the time for which the charge and discharge of the secondary battery is not sufficiently long, the salt concentration imbalance may be eliminated depending on the state in which the charge and discharge of the secondary battery are performed and the state in which the charge and discharge of the secondary battery are prohibited. Thus, it can be determined whether or not the second deterioration component is eliminated by monitoring the second deterioration component.

It can be determined that the second deterioration component is eliminated when the amount of the salt concentration imbalance is less than a threshold value. Since the second deterioration component is produced in association with the salt concentration imbalance, the determination of whether or not the second deterioration component is eliminated can be made by monitoring the amount of the salt concentration imbalance. For example, even when the charge and discharge of the secondary battery are continuously performed, the salt concentration imbalance may be eliminated depending on the balance between the charge and discharge. Thus, it can be determined whether or not the second deterioration component is eliminated by monitoring the amount of the salt concentration imbalance.

The second deterioration component can be calculated by using the following expression (I)

$$\Delta R_h = \left( \frac{\xi I_m}{I_r} - 1 \right) R_m \qquad (I)$$

In the expression (I), $\Delta R_h$ represents the second deterioration component, $\xi$ represents a correction coefficient including the resistance change rate. $I_m$ represents the estimated current, $I_r$ represents the measured current, and $R_m$ represents the first deterioration component.

The estimated current can be corrected by using not only the ratio between the resistance change rates but also a ratio between capacitance retention rates in estimating the second deterioration component. The ratio between the capacitance retention rates is a ratio between a capacitance retention rate when the second deterioration component is eliminated and a capacitance retention rate when charge and discharge of the secondary battery are performed.

According to a second aspect, the present invention provides an estimation method of estimating a deterioration state of a secondary battery, including measuring an electric current of the secondary battery, estimating the electric current of the secondary battery by using a battery model, and estimating a second deterioration component produced in association with a salt concentration imbalance in the secondary battery. The second deterioration component is estimated by using the measured current, the estimated current, and a first deterioration component produced in association with wear of the secondary battery. The estimated current is corrected by using a ratio between a resistance change rate of the secondary battery when the second deterioration component is eliminated and a resistance change rate during charge and discharge of the secondary battery.

Advantage of the Invention

The deterioration state of the secondary battery can be divided into the first deterioration component and the second deterioration component, and the second deterioration component included in the deterioration state can be estimated according to the present invention. The estimated current is corrected in estimating the second deterioration component, so that the accuracy of the estimation of the second deterioration component can be improved.

BRIEF DESCRIPTION OF THE DRAWINGS

FIG. 5 is a table showing a list of variables and the like used in a battery model expression.

MODE FOR CARRYING OUT THE INVENTION

An embodiment of the present invention will hereinafter be described.

Embodiment 1

A battery model used in the present embodiment is now described.

Figure 1:
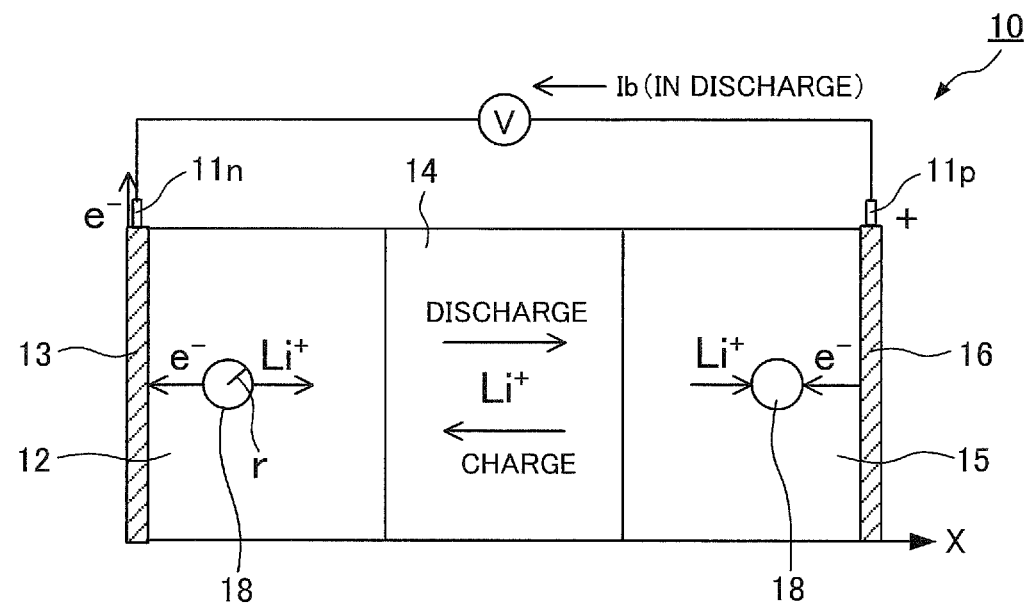
FIG. 1 is a schematic diagram showing the configuration of a secondary battery.

FIG. 1 is a schematic diagram showing the configuration of a secondary battery. A secondary battery 10 has a negative electrode (also referred to as an electrode) 12, a separator 14, and a positive electrode (also referred to as an electrode) 15. The separator 14 is located between the negative electrode 12 and the positive electrode 15 and contains an electrolytic solution. An x coordinate axis shown in FIG. 1 shows positions in a thickness direction of the electrode.

Each of the negative electrode 12 and the positive electrode 15 is formed of a group of spherical active materials 18. When the secondary battery 10 is discharged, a chemical reaction occurs at the interface of the active material 18 in the negative electrode 12 to release a lithium ion Li+ and an electron e−. In addition, a chemical reaction occurs at the interface of the active material 18 in the positive electrode 15 to absorb a lithium ion Li+ and an electron e−.

The negative electrode 12 has a collector plate 13 made of copper or the like. The collector plate 13 is electrically connected to a negative electrode terminal 11$n$ of the secondary battery 10. The positive electrode 15 has a collector plate 16 made of aluminum or the like. The collector plate 16 is electrically connected to a positive electrode terminal 11$p$ of the secondary battery 10. The lithium ions Li+ are passed between the negative electrode 12 and the positive electrode 15 to perform charge and discharge of the secondary battery 10 to produce a charge current Ib (>0) or a discharge current Ib (<0).

Figure 2:
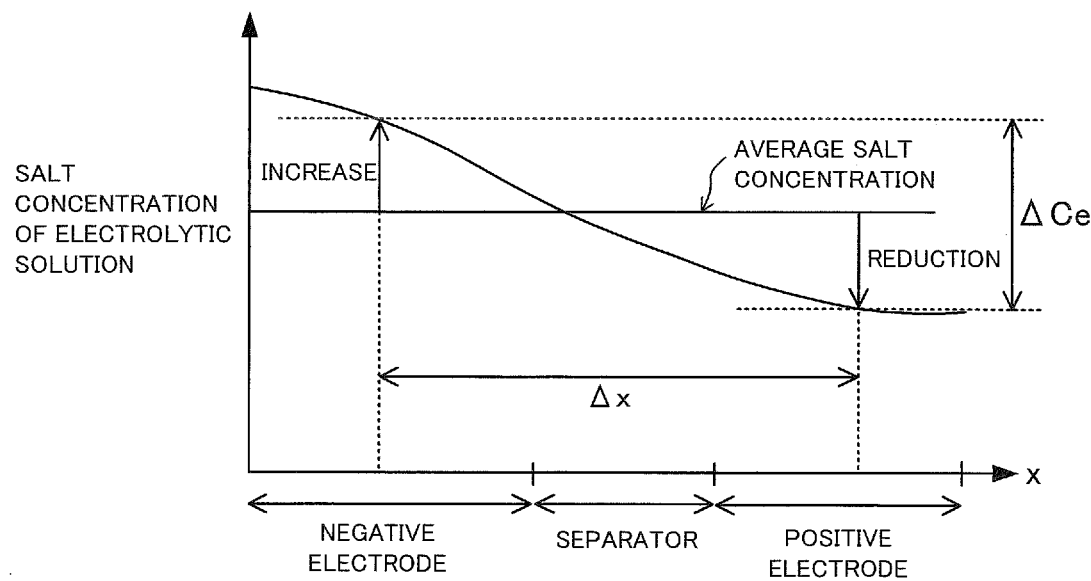
FIG. 2 is a graph for describing salt concentration distribution in an electrolytic solution in the secondary battery.

In discharge of the secondary battery 10, the lithium ions Li+ released from the negative electrode 12 are moved to the positive electrode 15 through diffusion and electrophoresis and are absorbed by the positive electrode 15. At this point, if the diffusion of the lithium ions Li+ in the electrolytic solution is delayed, the concentration of the lithium ions Li+ (that is, the salt concentration of the electrolytic solution) is increased in the electrolytic solution within the negative electrode 12. On the other hand, the concentration of the lithium ions Li+ is reduced in the electrolytic solution within the positive electrode 15. FIG. 2 shows this situation. The average salt concentration shown in FIG. 2 refers to a value when the salt concentration of the electrolytic solution is uniform throughout the secondary battery 10. The salt concentration of the electrolytic solution can be uniformized, for example by leaving the secondary battery 10 at rest for a long time.

Figure 3:
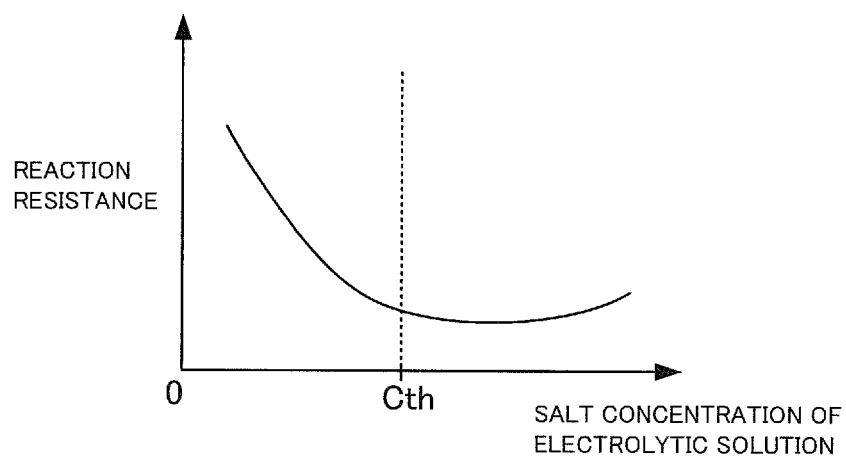
FIG. 3 is a graph showing a relationship between a salt concentration of the electrolytic solution and a reaction resistance.

FIG. 3 shows a relationship between the salt concentration of electrolytic solution and a reaction resistance. The reaction resistance refers to a resistance equivalently acting as an electrical resistance when a reaction current is produced at the interface of the active material 18, that is, a resistance component relating to the passing of the lithium ions Li+ at the electrode surface. The reaction resistance is also called a charge transfer resistance.

It can be seen from the characteristic diagram shown in FIG. 3 that the reaction resistance is a function of the salt concentration of electrolytic solution. Especially, in a region where the salt concentration of electrolytic solution is higher than a threshold value $c_{th}$, the reaction resistance mildly changes relative to changes in the salt concentration of electrolytic solution. In a region in which the salt concentration of electrolytic solution is lower than the threshold value $c_{th}$, the reaction resistance sharply changes relative to changes in the salt concentration of electrolytic solution. In other words, in the region in which the salt concentration of electrolytic solution is lower than the threshold value $c_{th}$, the reaction resistance changes at a higher rate relative to the salt concentration of electrolytic solution than in the region in which the salt concentration of electrolytic solution is higher than the threshold value $c_{th}$.

Referring to FIG. 2 and FIG. 3, even when the salt concentration of electrolytic solution is reduced within the positive electrode 15 during discharge, the reaction resistance hardly reduces if the salt concentration of electrolytic solution within the positive electrode 15 is higher than the threshold value $c_{th}$. On the other hand, when the salt concentration of electrolytic solution within the positive electrode 15 is lower than the threshold value $c_{th}$, a reduction in the salt concentration of electrolytic solution within the positive electrode 15 leads to an increase in the reaction resistance.

Figure 4A:
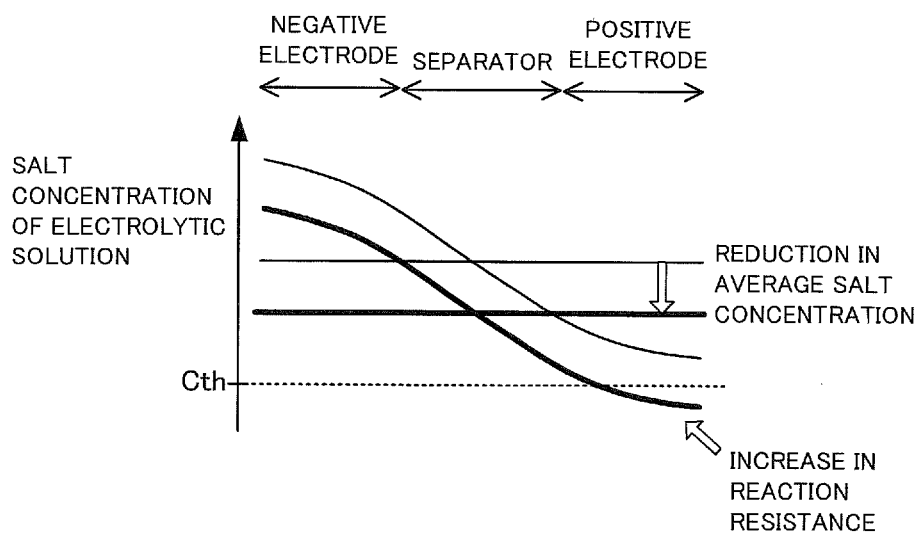
FIG. 4A is a graph for describing a reduction in the salt concentration of the electrolytic solution within an electrode.
Figure 4B:
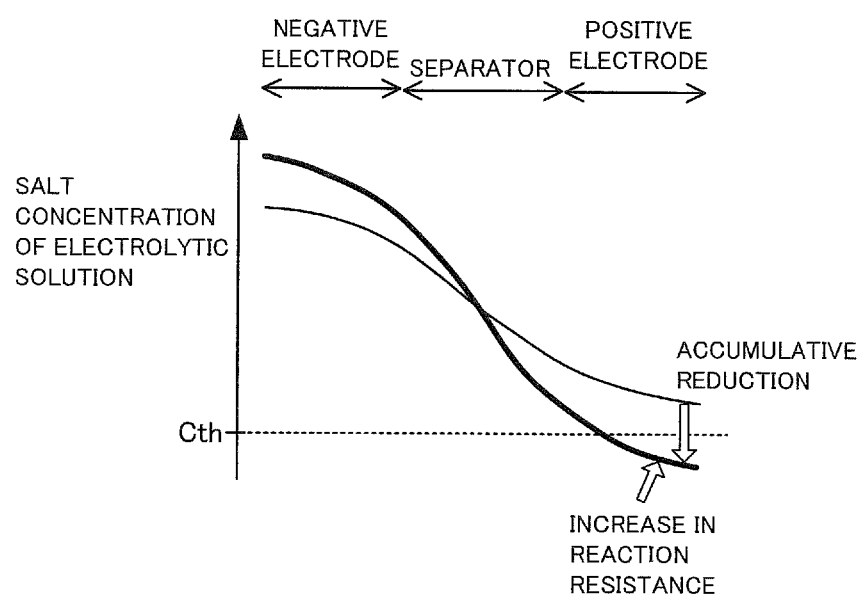
FIG. 4B is a graph for describing a reduction in the salt concentration of the electrolytic solution within the electrode.

A possible factor in the reaction resistance increase is, for example, a reduction in the average salt concentration of electrolytic solution which reduces the salt concentration of electrolytic solution within the positive electrode to a level lower than the threshold value $c_{th}$ as shown in FIG. 4A. It is also contemplated that repeated discharge accumulatively reduces the salt concentration of electrolytic solution within the positive electrode to result in a reduction in the salt concentration of electrolytic solution within the positive electrode to a level lower than the threshold value $c_{th}$ as shown in FIG. 4B, for example.

The description has been made of the case in which the reduction in the salt concentration of electrolytic solution within the positive electrode 15 during discharge causes the increase in the reaction resistance. The increase in the reaction resistance also occurs during charge from a reduction in the salt concentration of electrolytic solution within the negative electrode 12.

The sum of the reaction resistance and the purely electrical resistance (pure resistance) in the movement of the electrons e− in the electrodes 12 and 15 corresponds to a DC resistance component in a battery resistance (internal resistance) when the secondary battery 10 is observed from a macroscopic viewpoint.

A basic battery model expression used in the present embodiment is represented by basic equations including the following expressions (1) to (11). FIG. 5 shows a list of variables and constants used in the battery model expression.

In the variables and constants in the model expression described below, a subscript e means a value in the electrolytic solution and a subscript s means a value in the active material. A subscript j makes a distinction between the positive electrode and the negative electrode, wherein j equal to 1 means a value in the positive electrode and j equal to 2 means a value in the negative electrode. When the variables or the constants in the positive electrode and the negative electrode are collectively represented, the subscript j is omitted. The denotation of (t) representing a function of time, the denotation of (T) representing battery temperature dependence, the denotation of (θ) representing local SOCθ dependence and the like may be omitted in the present specification. A symbol # attached to the variables or the constants represents an average value.

$$\frac{j_j^{Li}(x, \theta_j, t)}{a_{sj}} = i_{0j}(x, \theta_j, T, t) \cdot \left[ \begin{array}{l} \exp\left(\frac{\alpha_{aj} F}{RT} \cdot \eta_j \#(x, \theta_j, t)\right) - \\ \exp\left(-\frac{\alpha_{cj} F}{RT} \cdot \eta_j \#(x, \theta_j, t)\right) \end{array} \right] \quad (1)$$

$$\eta_j(x, \theta_j, t) = \phi_{sj}(x, t) - \phi_{ej}(x, t) - U_j(x, \theta_j, t) \quad (2)$$

The above expressions (1) and (2) represent an electrochemical reaction in the electrode (active material) and are called the Butler-Volmer equation.

An expression (3) holds as an expression relating to the conservation law of lithium ion concentration within the electrolytic solution. A diffusion equation (4) and boundary condition expressions shown in expressions (5) and (6) are used as expressions relating to the conservation law of lithium ion concentration within the active material. The expression (5) represents a boundary condition at the center of the active material. The expression (6) represents a boundary condition at the interface between the active material and the electrolytic solution (hereinafter also referred to simply as an interface).

The local SOCθ$_j$ corresponding to local lithium ion concentration distribution at the active material interface is defined by an expression (7). In the expression (7), $c_{sei}$ represents the lithium concentration at the active material interface in the positive electrode and the negative electrode as shown in an expression (8), and $c_{sj,max}$ represents the maximum lithium concentration within the active material.

$$\frac{\delta[\varepsilon_{ej} \cdot c_{ej}(x, t)]}{\delta t} = \nabla \cdot \left[D_{ej}^{eff} \nabla c_{ej}(x, t)\right] + \frac{1 - t_+^0}{F} \cdot j_j^{Li}(x, \theta_i, t) - \frac{i_{ej} \cdot \nabla t_+^0}{F} \quad (3)$$

$$\frac{\partial c_{sj}(x, r_j, t)}{\partial t} = D_{sj}\left[\frac{\partial^2 c_{sj}}{\partial r_j^2} + \frac{2}{r_j}\frac{\partial c_{sj}}{\partial r_j}\right] \quad (4)$$

$$\left.\frac{\partial c_{sj}(x, r_j, t)}{\partial r}\right|_{r_j=0} = 0 \quad (5)$$

$$\left.\frac{\partial[\varepsilon_{sj} \cdot c_{sj}(x, r_j, t)]}{\partial t}\right|_{r_k=r_{sj}} = -\frac{j_j^{Li}(x, \theta_j, t)}{\alpha_{sj} F} \quad (6)$$

$$\theta_j = \frac{c_{sej}}{c_{sj,max}} \quad (7)$$

$$c_{sej} = c_{sj}(x, r_{sj}, t) \quad (8)$$

An expression (9) holds as an expression relating to the conservation law of charge within the electrolytic solution, and an expression (10) holds as an expression relating to the conservation law of charge within the active material. An expression (11) representing a relationship between a current density I(t) and a reaction current density $J_j^{Li}$ holds as an electrochemical reaction expression at the active material interface.

$$\nabla \cdot [\kappa_j^{eff}(x,t)\nabla\phi_{ej}(x,t)] + \nabla \cdot [\kappa_{Dj}^{eff}(x,t)\nabla \ln c_{ej}(x,t)] + j_j^{Li}(x,\theta,t) = 0 \qquad (9)$$

$$\nabla \cdot [\sigma_j^{eff}\nabla\phi_{sj}(x,t)] - j_j^{Li}(x,\theta_j,t) = 0 \qquad (10)$$

$$I(t) = \int_0^{L_j} j_j^{Li}(x,\theta_j,t)dx \qquad (11)$$

The battery model expression represented by the basic equations including the expressions (1) to (11) can be simplified as described below. The simplification of the battery model expression can reduce computing load or shorten a computing time.

It is assumed that a uniform electrochemical reaction is seen in each of the negative electrode 12 and the positive electrode 15. Specifically, it is assumed that the reaction in the x direction uniformly occurs in each of the electrodes 12 and 15. In addition, since it is assumed that uniform reactions occur in the plurality of active materials included in each of the electrodes 12 and 15, the active materials in each of the electrodes 12 and 15 are handled as a single active material model. Thus, the structure of the secondary battery shown in FIG. 1 can be modeled as a structure shown in FIG. 6.

Figure 6:
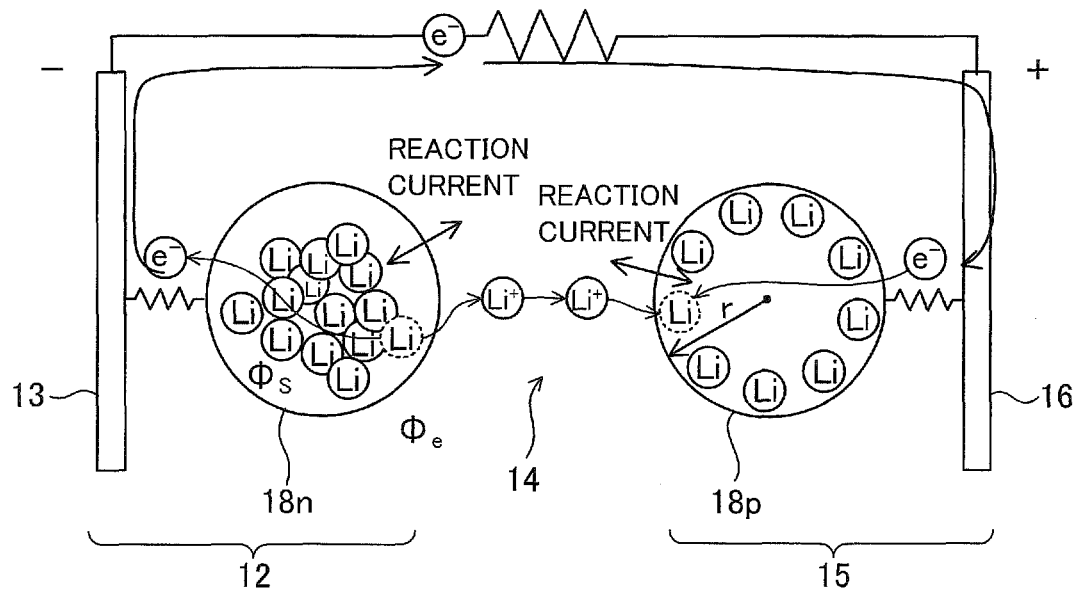
FIG. 6 is a conceptual diagram for describing the battery model.

In a battery model shown in FIG. 6, it is possible to model an electrode reaction on the surfaces of an active material model 18p (j=1) and an active material model 18n (j=2) during charge and discharge. In the battery model shown in FIG. 6, it is possible to model diffusion of lithium within the active material models 18p and 18n (diameter direction) and diffusion of lithium ions within the electrolytic solution (concentration distribution). In addition, potential distribution and temperature distribution can be modeled in each location of the battery model shown in FIG. 6.

Figure 7:
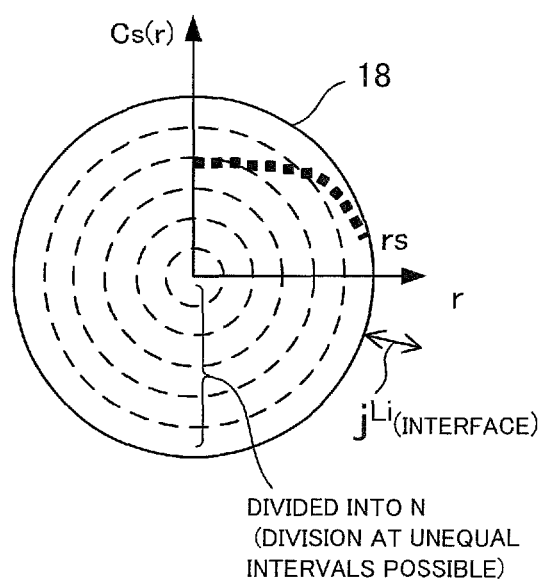
FIG. 7 is a conceptual diagram showing an active material model shown with polar coordinates.

As shown in FIG. 7, a lithium concentration $c_s$ within each of the active material models 18p and 18n can be represented as a function on a coordinate r in a radius direction of the active material models 18p and 18n (r represents a distance from the center of each point, $r_s$ represents the radius of the active material). It is assumed that position dependence in a circumferential direction of the active material models 18p and 18n is absent. The active material model shown in FIG. 7 is used to estimate a lithium diffusion phenomenon within the active material in association with the electrochemical reaction at the interface. Each of the active material models 18p and 18n is divided into N (N is a natural number larger than 2) in the diameter direction, and for each of the N areas (k=1 to N), a lithium concentration $c_{s,k}(t)$ is estimated in accordance with a diffusion equation, later described.

According to the battery model shown in FIG. 6, the basic equations (1) to (6) and (8) can be represented as the following expressions (1') to (6'), and (8').

$$\frac{j_j^{Li}\#(\theta_j,t)}{a_{sj}} = i_{0j}\#(\theta_j,T,t) \cdot \left[ \begin{array}{c} \exp\left(\frac{\alpha_{aj}F}{RT}\cdot\eta_j\#(\theta_j,t)\right) - \\ \exp\left(-\frac{\alpha_{cj}F}{RT}\cdot\eta_j\#(\theta_j,t)\right) \end{array} \right] \qquad (1')$$

$$\eta_j\#(\theta_j,t) = \phi_{sj}\#(t) - \phi_{ej}\#(t) - U_j\#(\theta_j,t) \qquad (2')$$

$$c_{ej}(t) = const. \qquad (3')$$

$$\frac{\partial c_{sj}(r_j,t)}{\partial t} = D_{sj}\left[\frac{\partial^2 c_{sj}}{\partial r_j^2} + \frac{2}{r_j}\frac{\partial c_{sj}}{\partial r_j}\right] \qquad (4')$$

$$\left.\frac{\partial c_{sj}(r_j,t)}{\partial r}\right|_{r_j=0} = 0 \qquad (5')$$

$$\left.\frac{\partial[\varepsilon_{sj}\cdot c_{sj}(r_j,t)]}{\partial t}\right|_{r_j=r_{sj}} = -\frac{j_j^{Li}\#(\theta_j,t)}{a_{sj}F} \qquad (6')$$

$$c_{sej} = c_{sj}(r_{sj},t) \qquad (8')$$

In the expression (3'), it is assumed that $c_{ej}(t)$ takes a constant value by assuming that the electrolytic solution has a concentration constant over time. For the active material models 18n and 18p, the diffusion equations (4) to (6) are transformed into the diffusion equations (4') to (6') in view of only the distribution in the polar coordinate distribution. In the expression (8'), the lithium concentration at the active material interface corresponds to the lithium concentration $c_{si}(t)$ in the outermost area of the N divided areas shown in FIG. 7.

The expression (9) relating to the conservation law of charge within the electrolytic solution is simplified into the following expression (12) by using the expression (3'). Thus, a potential $\phi_{ej}$ of the electrolytic solution is approximated as a quadric function of x. An average potential $\phi_{ej}\#$ within the electrolytic solution used for calculation of an overvoltage $\eta_j\#$ is determined from the following expression (13) provided by integrating the expression (12) with an electrode thickness $L_j$.

For the negative electrode 12, the following expression (14) holds on the basis of the expression (12). Thus, a potential difference between an electrolytic solution average potential $\phi_{e2}\#$ and an electrolytic solution potential at the boundary between the negative electrode 12 and the separator 14 is represented by the following expression (15). For the positive electrode 15, a potential difference between an electrolytic solution average potential $\phi_{e1}\#$ and an electrolytic solution potential at the boundary between the positive electrode 15 and the separator 14 is represented by the following expression (16).

$$\nabla \cdot [\kappa_j^{eff}(t)\nabla\phi_{ej}(x,t)] + j_j^{Li}\#(\theta_j,t) = 0 \Leftrightarrow \phi_{ej}(x,t) = -\frac{j_j^{Li}\#(\theta_j,t)}{2\kappa_j^{eff}}x^2 \qquad (12)$$

$$\phi_{ej}\#(t) = -\frac{j_j^{Li}\#(\theta_j,t)}{2\kappa_j^{eff}}\frac{1}{L_j}\int_0^{L_j}x^2 dx = -\frac{j_j^{Li}\#(\theta_j,t)}{6\kappa_j^{eff}}\cdot L_j^2 \qquad (13)$$

$$\phi_{e2}(L_2,t) = -\frac{j_2^{Li}\#(\theta_2,t)}{2\kappa_2^{eff}}L_2^2 \qquad (14)$$

$$\phi_{e2}\#(t) - \phi_{e2}(L_2,t) = -\frac{j_2^{Li}\#(\theta_2,t)}{6\kappa_2^{eff}}L_2^2 - \left(-\frac{j_2^{Li}\#(\theta_2,t)}{2\kappa_2^{eff}}L_2^2\right) \qquad (15)$$
$$= \frac{j_2^{Li}\#(\theta_2,t)}{3\kappa_2^{eff}}L_2^2$$
$$= \frac{L_2}{3\kappa_2^{eff}}I$$

$$\phi_{e1}\#(t) - \phi_{e1}(L_1,t) = \frac{j_1^{Li}\#(\theta_1,t)}{3\kappa_1^{eff}}L_1^2 = -\frac{L_1}{3\kappa_1^{eff}}I \qquad (16)$$

The expression (10) relating to the conservation law of charge within the active material can be simplified into the following expression (17). Thus, a potential $\phi_{sj}$ of the active material is also approximated as a quadratic function of x. An average potential $\phi_{sj}\#$ within the active material used for calculation of an overvoltage $\eta_j\#$ is determined from the following expression (18) provided by integrating the expression (17) with the electrode thickness $L_j$. For the positive electrode 15, a potential difference between an active material average potential $\phi_{s1}\#$ and an active material potential at the boundary between the active material 18p and the collector plate 16 is represented by the following expression (19). Similarly, for the negative electrode 12, the expression (20) holds.

$$\nabla \cdot [\sigma_j^{eff} \nabla \phi_{sj}(x, t)] - j_j^{Li}\#(\theta_j, t) = 0 \Leftrightarrow \phi_{sj}(x, t) = \frac{j_j^{Li}\#(\theta_j, t)}{2\sigma_j^{eff}} x^2 \quad (17)$$

$$\phi_{sj}\#(t) = \frac{j_j^{Li}\#(\theta_j, t)}{2\sigma_j^{eff}} \frac{1}{L_j} \int_0^{L_j} x^2 dx \quad (18)$$

$$\phi_{s1}\#(t) - \phi_{s1}(L_1, t) = -\frac{j_1^{Li}\#(\theta_1, t)}{3\sigma_1^{eff}} L_1^2 = \frac{L_1}{3\sigma_1^{eff}} I \quad (19)$$

$$\phi_{s2}\#(t) - \phi_{s2}(L_2, t) = -\frac{j_2^{Li}\#(\theta_2, t)}{3\sigma_2^{eff}} L_2^2 = -\frac{L_2}{3\sigma_2^{eff}} I \quad (20)$$

Figure 8:
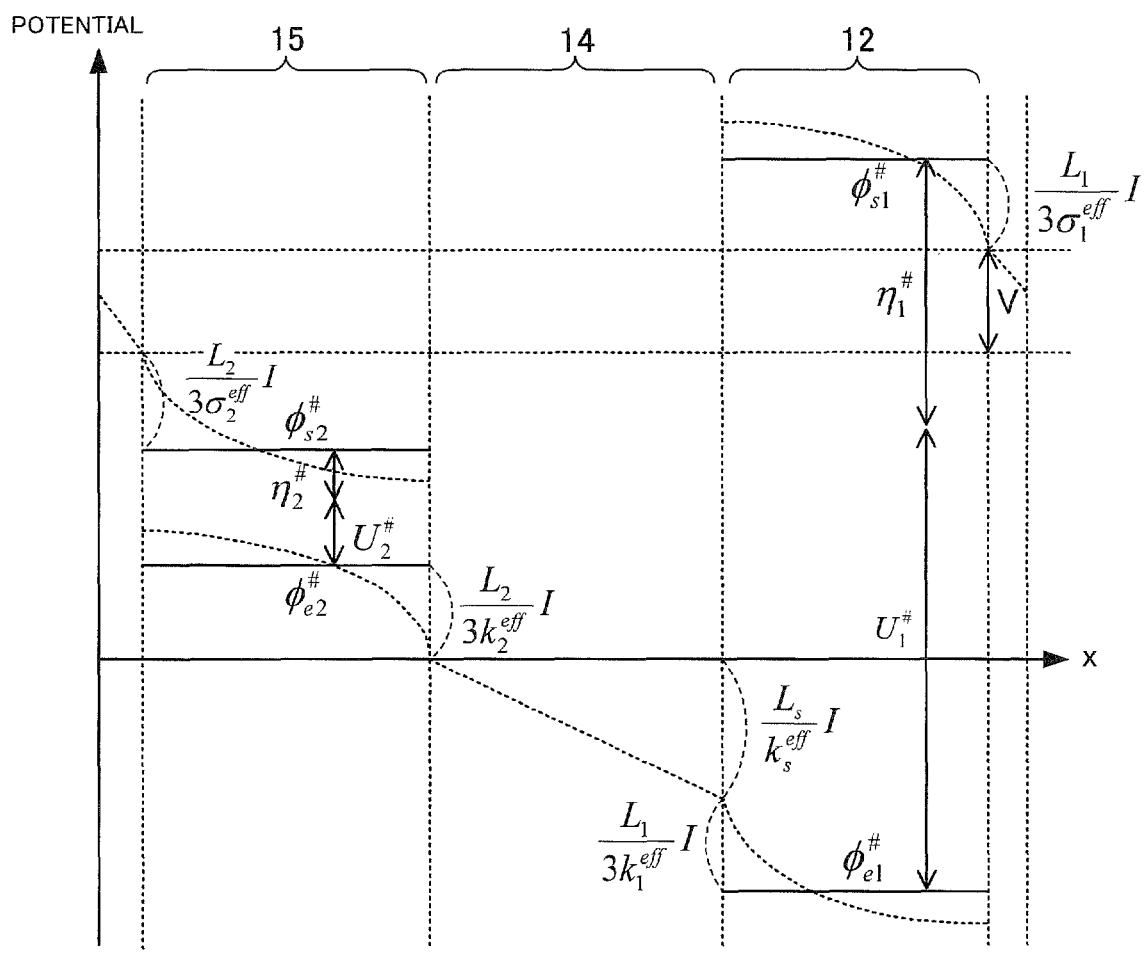
FIG. 8 is a graph showing a relationship between a terminal voltage of the secondary battery and various average potentials.

FIG. 8 shows a relationship between a terminal voltage V(t) of the secondary battery and each average potential determined as described above. In FIG. 8, since the reaction current density $j_j^{Li}$ is zero in the separator 14, a voltage drop in the separator 14 is proportional to the current density I(t) and is represented as $L_s/K_s^{eff} I(t)$.

Since the electrochemical reaction in each electrode is assumed to be uniform, the following expression (21) holds between the current density I(t) per unit area of the electrode plate and the reaction current density (lithium production amount) $J_j^{Li}$.

$$I(t) = -j_1^{Li}(\theta_1, t)L_1 = j_2^{Li}(\theta_2, t)L_2 \quad (21)$$

The following expression (22) holds for a battery voltage V(t) based on the potential relationship shown in FIG. 8 and the above expression (21). The expression (22) is premised on a potential relationship expression of an expression (23) shown in FIG. 8.

Next, an average overvoltage $\eta\#(t)$ is calculated. When $j_j^{Li}$ is set to be constant, and $\alpha_{aj}$ and $\alpha_{cj}$ are set to 0.5 with the same charge and discharge efficiency in the Butler-Volmer equation, then the following expression (24) holds. The expression (24) is inversely transformed to determine the average overvoltage $\eta\#(t)$ from the following expression (25).

$$V(t) = \phi_{s1}\#(t) - \frac{L_1}{3\sigma_1^{eff}} I(t) - \left(\phi_{s2}\#(t) + \frac{L_2}{3\sigma_2^{eff}} I(t)\right) \quad (22)$$

$$\phi_{sj}\#(t) = U_j\#(t) + \phi_{ej}\#(t) + \eta_j\#(t) \quad (23)$$

$$j_j^{Li}\# = a_{sj}i_{0j}(\theta_j, t) \cdot \left[\exp\left(\frac{\alpha_{aj}F}{RT} \cdot \eta_j\#(t)\right) - \exp\left(\frac{\alpha_{cj}F}{RT} \cdot \eta_j\#(t)\right)\right] \quad (24)$$

$$= 2a_{sj}i_{0j}(\theta_j, t)\sinh\left(\frac{\alpha_{aj}F}{RT} \cdot \eta_j\#(t)\right)$$

$$\eta_j\#(t) = \frac{RT}{\alpha_{aj}F}\text{arcsinh}\left(\frac{j_j^{Li}\#(\theta_j, t)}{2a_{sj}i_{0j}(\theta_j, t)}\right) \quad (25)$$

Average potentials $\phi_{s1}$ and $\phi_{s2}$ are determined with FIG. 8, and the determined values are substituted into the expression (22). Average overvoltages $\eta_1\#(t)$ and $\eta_2\#(t)$ determined from the expression (25) are substituted into the expression (23). As a result, a voltage-current relation model expression (M1a) in accordance with the electrochemical reaction model expression is derived on the basis of the expressions (1'), (21), and the expression (2').

An active material diffusion model expression (M2a) for the active material models 18p and 18n is calculated from the expression (4') corresponding to the conservation law of lithium concentration (diffusion equation) and the boundary condition expressions (5') and (6').

$$V(t) = U_1\#(\theta_1, t) - U_2\#(\theta_2, t) + \quad (M1a)$$

$$\frac{RT}{\alpha_{a1}F}\left\{\begin{array}{l}\text{arcsinh}\left(\frac{-I(t)}{2L_1 a_{s1} i_{01}(\theta_1, T, t)}\right) - \\ \text{arcsinh}\left(\frac{I(t)}{2L_2 a_{s2} i_{02}(\theta_2, T, t)}\right)\end{array}\right\} -$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$\frac{\partial c_{s1}(r_1, t)}{\partial t} = D_{s1}(T)\left[\frac{\partial^2 c_{s1}}{\partial r_1^2} + \frac{2}{r_1}\frac{\partial c_{s1}}{\partial r_1}\right]$$

$$\frac{\partial c_{s2}(r_2, t)}{\partial t} = D_{s2}(T)\left[\frac{\partial^2 c_{s2}}{\partial r_2^2} + \frac{2}{r_2}\frac{\partial c_{s2}}{\partial r_2}\right] \quad (M2a)$$

The first term of the right side of the model expression (M1a) represents an OCV (Open Circuit Voltage) determined by the concentration of the reaction material (lithium) at the active material surface. The second term of the right side represents the overvoltage ($\eta_1\#-\eta_2\#$). The third term of the right side represents the voltage drop with the battery current. Thus, the DC pure resistance of the secondary battery 10 is represented by Rd (T) in the expression (M1a).

Figure 9:
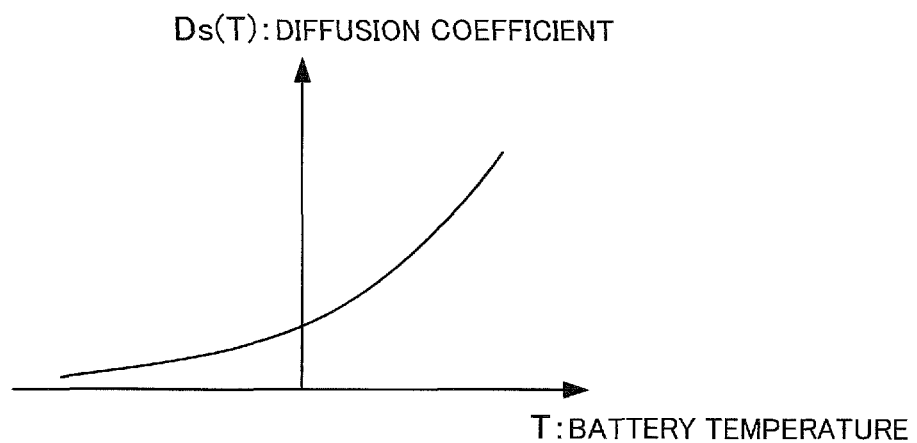
FIG. 9 is a graph for describing temperature dependence of a diffusion coefficient.

In the expression (M2a), diffusion coefficients $D_{s1}$ and $D_{s2}$ used as parameters for specifying the diffusion speed of the lithium corresponding to the reaction material have temperature dependence. Thus, the diffusion coefficients $D_{s1}$ and $D_{s2}$ can be set, for example by using a map shown in FIG. 9. The map shown in FIG. 9 can be previously obtained. In FIG. 9, a battery temperature T on the horizontal axis represents temperatures obtained by using a temperature sensor. As shown in FIG. 9, the diffusion coefficients $D_{s1}$ and $D_{s2}$ reduce as the battery temperature drops. In other words, the diffusion coefficients $D_{s1}$ and $D_{s2}$ increase as the battery temperature rises.

For the diffusion coefficients $D_{s1}$ and $D_{s2}$, dependence on the local SOC$\theta$ may be considered in addition to the temperature dependence. In this case, preferably, a map representing a relationship between the battery temperature T, the local SOC$\theta$, and the diffusion coefficients $D_{s1}$ and $D_{s2}$ is previously prepared.

Figure 10A:
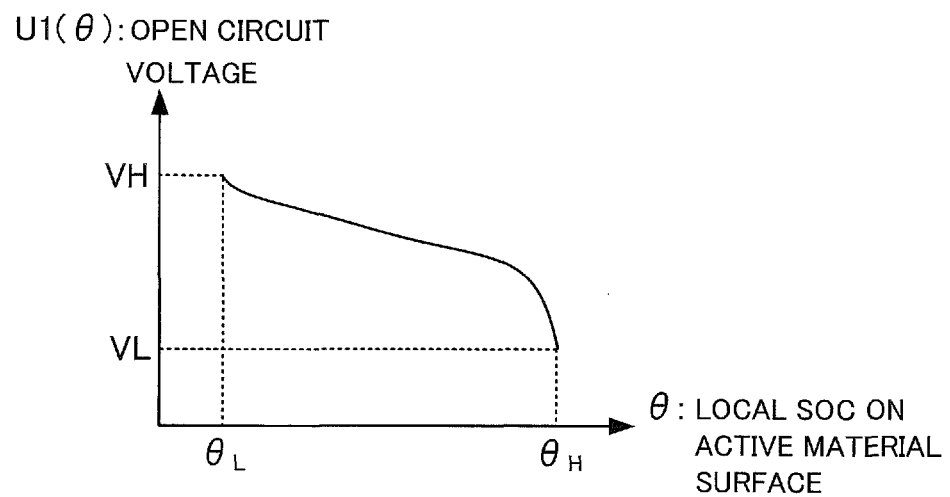
FIG. 10A is a graph showing a relationship between an open circuit voltage (positive electrode) and a local SOC.
Figure 10B:
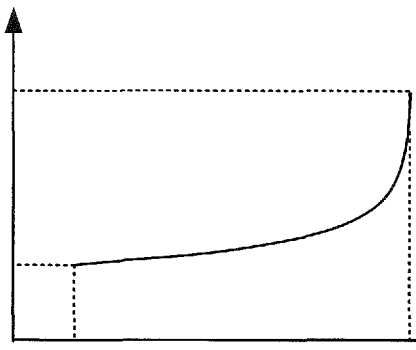
FIG. 10B is a graph showing a relationship between an open circuit voltage (negative electrode) and the local SOC.

As shown in FIG. 10A, the open circuit voltage $U_1$ included in the expression (M1a) reduces as the local SOC$\theta$ increases. As shown in FIG. 10B, the open circuit voltage $U_2$ increases as the local SOC$\theta$ increases. When the maps shown in FIG. 10A and FIG. 10B are previously prepared, the open circuit voltage $U_1$ and $U_2$ can be specified in association with the local SOC$\theta$.

Exchange current densities $i_{01}$ and $i_{02}$ included in the expression (M1a) have dependence on the local SOC$\theta$ and the battery temperature T. Thus, when a map representing a relationship between the exchange current densities $i_{01}$ and $i_{02}$, the local SOC$\theta$, and the battery temperature T is previously prepared, the exchange current densities $i_{01}$ and $i_{02}$ can be specified from the local SOC$\theta$ and the battery temperature T.

A DC pure resistance Rd has dependence on temperature. Thus, when a map representing a relationship between the DC pure resistance Rd and the battery temperature T is previously prepared, the DC pure resistance Rd can be specified from the battery temperature T. The abovementioned maps can be formed on the basis of the results of experiments such as well-known AC impedance measurements for the secondary battery 10.

The battery model shown in FIG. 6 can be further simplified. Specifically, a common active material model can be used as the active materials in the electrodes 12 and 15. The active material models 18n and 18p shown in FIG. 6 can be handled as the single active material model to perform the replacement of the expression as shown in the following expression (26). In the expression (26), the subscript j indicating a distinction between the positive electrode 15 and the negative electrode 12 is omitted.

$$U(\theta,t)=U_1\#(\theta_1,t)-U_2\#(\theta_2,t)$$

$$i_{0j}(\theta_j,T,t)=i_0(\theta,T,t)$$

$$c_{sj}(r_j,t)=c_s(r,t)$$

$$D_{sj}=D_s$$

$$a_{sj}=a_s$$

$$L_j=L$$

$$\alpha_{sj}=\alpha_s,$$

$$\theta_j=\theta_1 \tag{26}$$

The model expressions (M1a) and (M2a) can be represented by the following expressions (M1b) and (M2b), respectively. For the battery model using the single active material model, an expression (21') is used instead of the expression (21) as a relationship expression of the current density I(t) and the reaction current density $j_j^{Li}$.

$$V(t) = U(\theta, t) + \frac{RT}{\alpha_a F}\text{arcsinh}\left(\frac{-I(t)}{2La_s i_0(\theta, T, t)}\right) - \tag{M1b}$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$\frac{\partial c_s(r,t)}{\partial t} = D_s(T)\left[\frac{\partial^2 c_s}{\partial r^2} + \frac{2}{r}\frac{\partial c_s}{\partial r}\right] \tag{M2b}$$

$$I(t) = -L \cdot j^{Li}\#(\theta, t) \tag{21'}$$

An arcsin h term in the expression (M1a) can be linearly approximated to provide an expression (M1c). The linear approximation can reduce the computing load and shorten the computing time.

$$V(t) = U_1\#(\theta_1, t) - U_2\#(\theta_2, t) + \tag{M1c}$$

$$\frac{RT}{\alpha_{a1}F}\frac{-I(t)}{2L_1 a_{s1} i_{01}(\theta_1, T, t)} - \frac{RT}{\alpha_{a1}F}\frac{I(t)}{2L_2 a_{s2} i_{02}(\theta_2, T, t)} -$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$Rr(\theta_1, \theta_2, T) = \frac{RT}{2\alpha_{a1}F}\left\{\frac{1}{L_1\alpha_{s1}i_{01}(\theta_1,T)} + \frac{1}{L_2\alpha_{s2}i_{02}(\theta_2,T)}\right\} \tag{27}$$

$$V(t) = U_1\#(\theta_1,t) - U_2\#(\theta_2,t) - Rr(\theta_1,\theta_2,T)I(t) - Rd(T)\cdot I(t) \tag{28}$$

In the expression (M1c), a second term of the right side is represented by the product of the current density I(t) and a reaction resistance Rr as a result of the linear approximation. As shown in an expression (27), the reaction resistance Rr is calculated from the exchange current densities $i_{01}$ and $i_{02}$ dependent on the local SOCθ and the battery temperature T. Thus, when the expression (M1c) is used, the map representing a relationship between the local SOCθ, the battery temperature T, and the exchange current densities $i_{01}$ and $i_{02}$ may be previously prepared. According to the expression (M1c) and the expression (27), an expression (28) is obtained.

An arcsin h term corresponding to a second term of the right side in the expression (M1b) can be linearly approximated to provide an expression (M1d).

$$V(t) = U(\theta, t) + \frac{RT}{\alpha_a F}\frac{-I(t)}{2L_1 a_s i_0(\theta, t)} - \tag{M1d}$$

$$I(t)\left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

$$-Rr(\theta, t)\cdot I(t) = \frac{RT}{\alpha_a F}\frac{-I(t)}{2L_1 a_s i_0(\theta, t)}$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

The expression (M1b) can be represented as an expression (M1e).

$$V(t) = U(\theta,t) - I(t)Rd(T) + \frac{RT}{\alpha_a F}\text{arcsinh}\left[\frac{-I(t)\times g_r}{2La_s i_0(\theta,T,t)}\right] \tag{M1e}$$

A DC resistance change rate $g_r$ included in the expression (M1e) is represented by an expression (29).

$$g_r = \frac{R_a}{R_{an}} \tag{29}$$

In the expression (29), $R_{an}$ represents a DC resistance of the secondary battery 10 in an initial state, and $R_a$ represents a DC resistance of the secondary battery 10 after use (after charge and discharge). The initial state refers to the state immediately after the manufacture of the secondary battery 10. The DC resistance $R_{an}$ is not limited to the DC resistance of the secondary battery 10 in the initial state. It is only required that the DC resistance $R_{an}$ should be a value (fixed value) serving as a reference relative to changes in the DC resistance $R_a$. For example, the DC resistance $R_{an}$ can be set to a (arbitrary) value between the DC resistance immediately after the manufacture of the secondary battery 10 and the DC resistance (estimated value) when the secondary battery 10 is deteriorated at the highest level.

Since the DC resistance changes with age deterioration of the secondary battery 10 resulting from the use thereof, the DC resistance $R_a$ is higher than the DC resistance $R_{an}$. The resistance change rate $g_r$ is a value larger than one. In the present embodiment, the DC resistance change rate and the reaction resistance change rate are assumed to be equal to each other.

The expression (M1e) is represented by an expression (M1f) through linear approximation.

$$V(t) = U(\theta, t) - I(t)Rd(T) + \frac{RT}{\alpha_a F} \frac{-I(t) \times g_r}{2La_s i_o(\theta, T, t)} \quad (\text{M1f})$$

Figure 11:
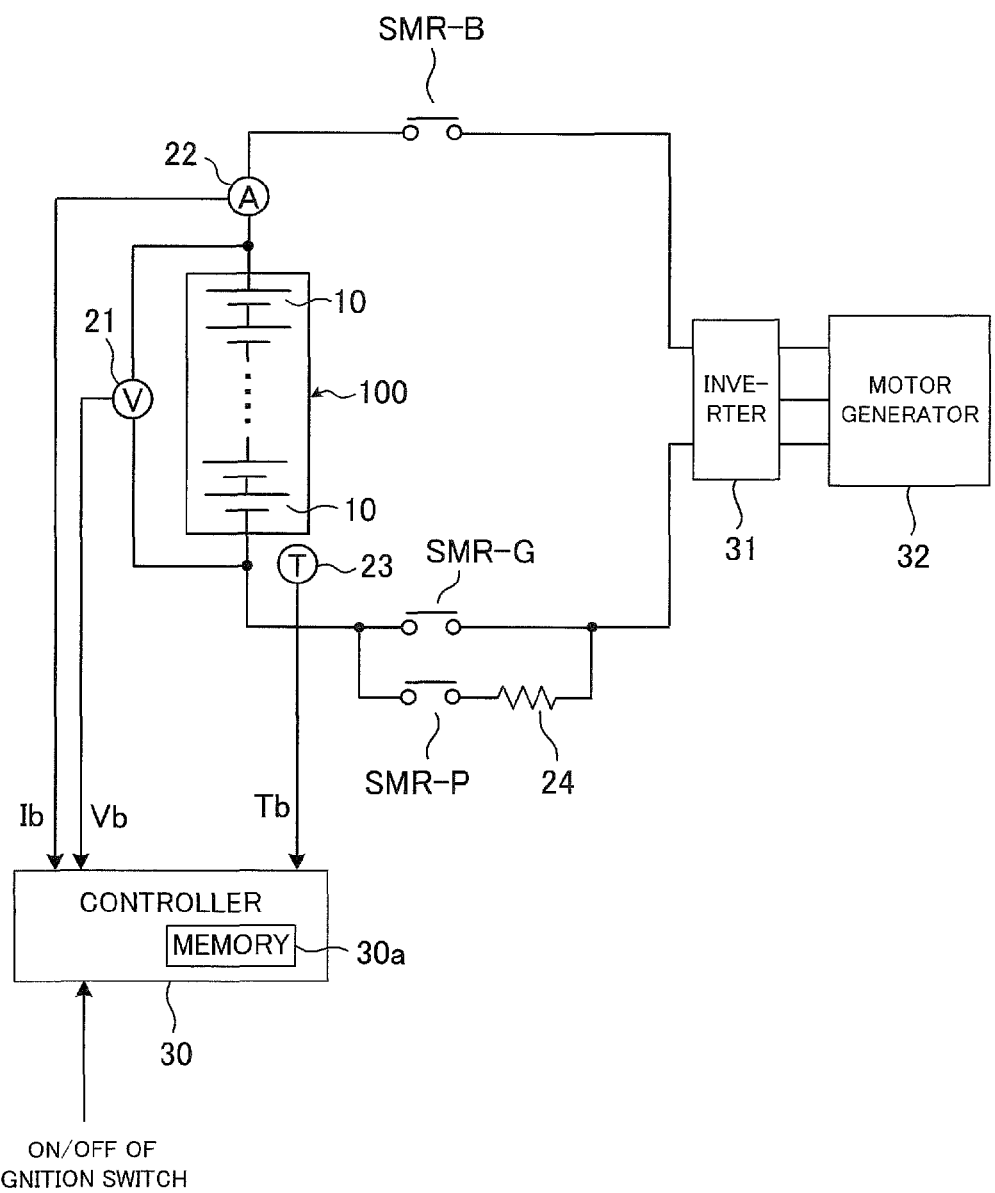
FIG. 11 is a schematic diagram showing the configuration of a battery system.

Next, a battery system in the present embodiment is described. FIG. 11 is a diagram showing the configuration of the battery system in the present embodiment. The battery system of the present embodiment is mounted on a vehicle. Examples of the vehicle include an HV (Hybrid Vehicle), a PHV (Plug-in Hybrid Vehicle), and an EV (Electric Vehicle). The HV includes not only a battery pack, later described, but also another power source such as an internal combustion and a fuel cell as a power source for running of the vehicle. The PHV allows charge of the battery pack by using electric power from an external power source in the HV. The EV includes only the battery pack as the power source of the vehicle.

A battery pack 100 has a plurality of secondary batteries 10 connected in series. The number of the secondary batteries 10 constituting the battery pack 100 can be set as appropriate based on the required output or the like. A voltage sensor 21 detects a voltage between terminals of the battery pack 100 and outputs the detection result to a controller 30. The voltage detected by the voltage sensor 21 can be divided by the number of the secondary batteries 10 constituting the battery pack 100 to determine a voltage Vb of the secondary battery 10. If the voltage sensor 21 is provided for each of the secondary batteries 10, the voltage detected by the voltage sensor 21 corresponds to the voltage Vb of the secondary battery 10.

A current sensor 22 detects a charge or discharge current Ib flowing through the battery pack 100 and outputs the detection result to the controller 30. The charge current Ib is set to a positive value and the discharge current Ib is set to a negative value. A temperature sensor 23 detects a temperature Tb of the battery pack 100 and outputs the detection result to the controller 30.

The controller 30 has a memory 30a which has various types of information stored therein for allowing the controller 30 to perform predetermined processing (for example, processing described in the present embodiment). While the memory 30a is contained in the controller 30 in the present embodiment, the memory 30a may be provided outside the controller 30.

A system main relay SMR-B is connected to a positive electrode terminal of the battery pack 100. The system main relay SMR-B is switched between ON and OFF in response to a control signal from the controller 30. A system main relay SMR-G is connected to a negative electrode terminal of the battery pack 100. The system main relay SMR-G is switched between ON and OFF in response to a control signal from the controller 30.

A system main relay SMR-P and a limiting resistor 24 are connected in parallel with the system main relay SMR-G. The system main relay SMR-P is switched between ON and OFF in response to a control signal from the controller 30. The limiting resistor 24 is used for suppressing a flow of inrush current when the battery pack 100 is connected to a load (specifically, an inverter 31).

For connecting the battery pack 100 to the inverter 31, the controller 30 first switches the system main relay SMR-B from OFF to ON and switches the system main relay SMR-P from OFF to ON. This causes an electric current to pass through the limiting resistor 24.

Next, the controller 30 switches the system main relay SMR-G from OFF to ON and then switches the system main relay SMR-P from ON to OFF. This completes the connection between the battery pack 100 and the inverter 31. The controller 30 receives information about ON/OFF of an ignition switch, and the controller 30 connects the battery pack 100 to the inverter 31 in response to switching of the ignition switch from OFF to ON.

On the other hand, when the ignition switch is switched from ON to OFF, the controller 30 switches the system main relays SMR-B and SMR-G from ON to OFF. This breaks the connection between the battery pack 100 and the inverter 31.

The inverter 31 converts a DC power from the battery pack 100 into an AC power and outputs the AC power to a motor generator 32. A three-phase AC motor can be used as the motor generator 32, for example. The motor generator 32 receives the AC power from the inverter 31 to generate a kinetic energy for running of the vehicle. The kinetic energy generated by the motor generator 32 is transferred to wheels.

For decelerating or stopping the vehicle, the motor generator 32 converts a kinetic energy produced in braking of the vehicle into an electric energy (AC power). The inverter 31 converts the AC power generated by the motor generator 32 into a DC power and outputs the DC power to the battery pack 100. This allows the battery pack 100 to accumulate the regenerative power.

While the battery pack 100 is connected to the inverter 31 in the present embodiment, the present invention is not limited thereto. Specifically, the battery pack 100 may be connected to a step-up circuit which may be connected to the inverter 31. The use of the step-up circuit can increase the output voltage of the battery pack 100. The step-up circuit can also reduce the voltage of the output from the inverter 31 to the battery pack 100.

Figure 12:
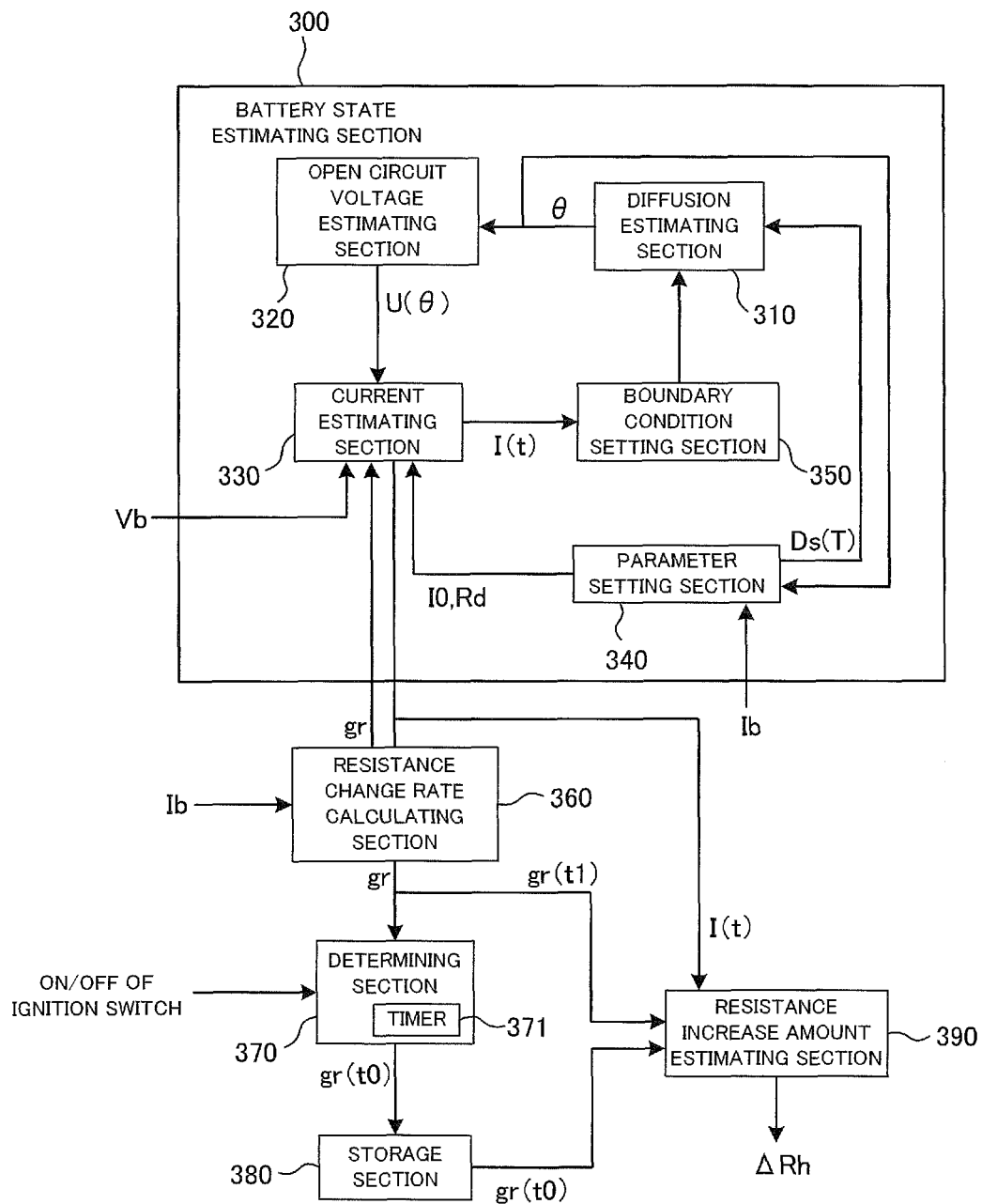
FIG. 12 is a schematic diagram showing the internal configuration of a controller.

FIG. 12 is a schematic diagram showing the internal configuration of the controller 30. A battery state estimating section 300 includes a diffusion estimating section 310, an open circuit voltage estimating section 320, a current estimating section 330, a parameter setting section 340, and a boundary condition setting section 350. In the configuration shown in FIG. 12, the battery state estimating section 300 uses the expression (M1f) and the expression (M2b) to calculate the current density I(t) and outputs the calculation result to a resistance change rate calculating section 360.

While the current density I(t) is calculated by using the expression (M1f) in the present embodiment, the present invention is not limited thereto. Specifically, the current density I(t) can be calculated on the basis of an arbitrary combination of any of the expression (M1a) to the expression (M1e) and the expression (M2a) or the expression (M2b). Since the resistance change rate $g_r$ is used in the present embodiment, the current density I(t) is multiplied by the resistance change rate $g_r$ in the arcsin h term or the term provided by the linear approximation of the arcsin h term in the expression (M1a) to the expression (M1d) when those expressions are used.

The diffusion estimating section 310 uses the expression (M2b) to calculate the lithium concentration distribution within the active material based on the boundary condition set in the boundary condition setting section 350. The boundary condition is set on the basis of the expression (5') or the expression (6'). The diffusion estimating section 310 uses the expression (7) to calculate the local SOCθ based on the calculated lithium concentration distribution. The diffusion estimating section 310 outputs information about the local SOCθ to the open circuit voltage estimating section 320.

The open circuit voltage estimating section 320 specifies the open circuit voltage $U_1$ and $U_2$ of the electrodes 12 and 15 based on the local SOCθ calculated by the diffusion estimating section 310. Specifically, the open circuit voltage estimating section 320 can use the maps shown in FIG. 10A and FIG. 10B to specify the open circuit voltage $U_1$ and $U_2$. The open circuit voltage estimating section 320 can calculate the open circuit voltage of the secondary battery 10 based on the open circuit voltage $U_1$ and $U_2$. The open circuit voltage of the secondary battery 10 is provided by subtracting the open circuit voltage $U_2$ from the open circuit voltage $U_1$.

The parameter setting section 340 sets parameters used in the battery model expression in accordance with the battery temperature T and the local SOCθ. The temperature Tb detected by the temperature sensor 23 is used as the battery temperature T. The local SOCθ is obtained from the diffusion estimating section 310. The parameters set by the parameter setting section 340 include a diffusion constant $D_s$ in the expression (M2b), and the current density $i_0$ and the DC resistance Rd in the expression (M1f).

The current estimating section 330 uses the following expression (M3a) to calculate (estimate) the current density I(t). The expression (M3a) is provided by transforming the expression (M1f). In the expression (M3a), an open circuit voltage U(θ, t) corresponds to an open circuit voltage U(θ) estimated in the open circuit voltage estimating section 320. A voltage V(t) corresponds to the battery voltage Vb obtained by the voltage sensor 21. Rd(t) and $i_0$(θ, T, t) are values set in the parameter setting section 340. In the expression (M3a), $g_r$ corresponds to the resistance change rate $g_r$ calculated by the resistance change rate calculating section 360.

$$I(t) = \frac{U(\theta, t) - V(t)}{Rd(T) + \frac{RTg_r}{\alpha_a F 2 L a_s i_o(\theta, T, t)}} \quad \text{(M3a)}$$

When any of the expression (Mia) to the expression (Mie) is used, the current density I(t) can also be calculated in the same manner as that for the expression (M3a) described above.

The boundary condition setting section 350 uses the expression (21) or the expression (21') to calculate the reaction current density (lithium production amount) $j_j^{Li}$ from the current density I(t) calculated by the current estimating section 330. The boundary condition setting section 350 uses the expression (6') to update the boundary condition in the expression (M2b).

The resistance change rate estimating section 360 calculates the resistance change rate $g_r$ represented by the above expression (29).

The DC resistance Ra changes with changes in the local SOCθ and the battery temperature T. Thus, a map representing the relationship between the DC resistance Ra, the local SOCθ, and the battery temperature T can be previously obtained by conducting an experiment with the secondary battery 10 in the initial state. The map can be stored in the memory. The DC resistance Ra changes not only with the changes in the local SOCθ and the battery temperature T but also with age deterioration of the secondary battery 10 resulting from the use thereof (charge and discharge).

The resistance change rate calculating section 360 uses the following expression (30) to calculate the resistance change rate $g_r$. The resistance change rate calculating section 360 outputs information about the calculated resistance change rate $g_r$ to the current estimating section 330, a determining section 370, and a resistance increase amount estimating section 390.

$$U(\theta) - V(t) = R_{an}(\theta, T) \cdot I(t) \times g_r \quad (30)$$

In the expression (30), the open circuit voltage U(θ) represents the value estimated by the open circuit voltage estimating section 320, and V(t) represents the battery voltage Vb obtained from the voltage sensor 21. $R_{an}$ represents a value specified from the map representing the relationship between the battery temperature T, the local SOCθ, and the DC resistance $R_a$ by specifying the battery temperature T and the local SOCθ. The current density I(t) is a value provided by dividing the current value Ib measured by the current sensor 22 by a unit electrode plate area.

The determining section 370 includes a timer 371 and determines whether or not a high-rate resistance increase is eliminated. The phenomenon relating to the high-rate resistance increase is described later. It has been shown that the high-rate resistance increase amount reduces when the secondary battery 10 is left at rest without charge and discharge. Thus, the determining section 370 determines whether or not a measured time during which the secondary battery 10 is left at rest is longer than a predefined rest time trest, and determines that the high-rate resistance increase is eliminated when the measured time is longer than the rest time trest.

The determining section 370 receives input of information about ON/OFF of the ignition switch. When the ignition switch is switched from ON to OFF, the determining section 370 determines that the secondary battery 10 is left at rest.

A storage section 380 stores the resistance change rate $g_r$ obtained when the high-rate resistance increase is eliminated (hereinafter represented as $g_r$(t0)). The resistance change rate $g_r$(t0) is a value calculated by the resistance change rate calculating section 360. The resistance increase amount estimating section 390 calculates (estimates) a high-rate resistance increase amount ΔRh.

The high-rate resistance increase occurs when an error is present between the current density I(t) estimated by the current estimating section 330 (referred to as an estimated current density) and the current density I(t) obtained from the current Ib measured by the current sensor 21 (referred to as a measured current density). The estimated current density I(t) and the measured current density I(t) are current densities obtained at the same timing. The occurrence of the high-rate resistance increase is described below.

In the battery model described above, the battery model expression is derived assuming that all of the currents pass through the active material 18 to be involved in the electrochemical reaction. In reality, however, especially at low temperature or the like, an electric double-layer capacitor may be produced at the interface between the electrolytic solution and the active material to split the battery current into an electrochemical reaction current component involved in the electrochemical reaction and a capacitor current component passing through the capacitor. In this case, the battery model expression is preferably configured such that the capacitor current component is separated from the electrochemical reaction current component.

The basic battery model described above includes the modeling of the reaction of the lithium ions Li+ on the surfaces of the electrodes 12 and 15, the diffusion of the lithium ions Li+ in the active materials 18 of the electrodes 12 and 15, and the diffusion of the lithium ions Li+ in the electrolytic solution. On the other hand, the simplified battery model used in the battery state estimating section 300 is provided on the assumption that the reaction in the electrode thickness direction is uniform and the assumption that the concentrations of the lithium ions Li+ in the electrodes 12 and 15 are constant in the basic battery model.

When the concentration of the lithium ions Li+ in the electrolytic solution, that is, the salt concentration of the electrolytic solution is sufficiently high, the above assumptions in the simplified battery model can be satisfied. At the sufficiently high salt concentration of the electrolytic solution, even when the salt concentration of the electrolytic solution within the electrode is changed due to charge and discharge, the change in the salt concentration has a slight influence on the reaction resistance. Thus, the current density I(t) can be estimated with high accuracy.

On the other hand, the above assumptions in the simplified battery model do not take account of an increase in the reaction resistance found when the salt concentration of the electrolytic solution within the electrode is low. The increase in the reaction resistance is referred to as the high-rate resistance increase. Thus, an error is present between the current density I(t) estimated in the simplified battery model and the current density obtained from the current Ib detected by the current sensor 22.

In view of this point, the high-rate resistance increase (index) can be estimated on the basis of the error of the current density. For example, the diffusion equation of the salt concentration (lithium ion concentration) of the electrolytic solution can be simplified to estimate the salt concentration change in the electrolytic solution within the electrode based on expressions (31) and (32).

$$\Delta c_e(t + \Delta t) = \Delta c_e(t) - \alpha \Delta c_e(t) + \beta I(t + \Delta t) \quad (31)$$

$$\alpha = \frac{2\Delta t D_{eff}(T)}{\varepsilon_e \Delta x^2}, \beta = \frac{1 - t_+^0}{F} \frac{\Delta t}{\varepsilon_e \Delta x} \quad (32)$$

In the expressions (31) and (32), $\Delta c_e$ represents a difference between the salt concentration of the electrolytic solution within the negative electrode and the salt concentration of the electrolytic solution within the positive electrode (see FIG. 2). $D_{eff}$ represents an effective diffusion coefficient of the electrolytic solution, $\varepsilon_e$ represents a volume fraction of the electrolytic solution, $t_+^0$ represents a transference number of the lithium ion Li+, and F represents the Faraday's constant. $\Delta t$ represents a time interval (time steps) in performing the estimation processing of the current density, and $\Delta x$ represents a diffusion distance (see FIG. 2). T represents the battery temperature, and I(t) represents the current density.

For example, when the secondary battery 10 is discharged, the salt concentration difference $\Delta c_e$ is the sum of an increase in the salt concentration in the negative electrode and a reduction in the salt concentration in the positive electrode as shown in FIG. 2. The increase and the reduction in the salt concentration are the amount of change relative to the average salt concentration.

Figure 13:
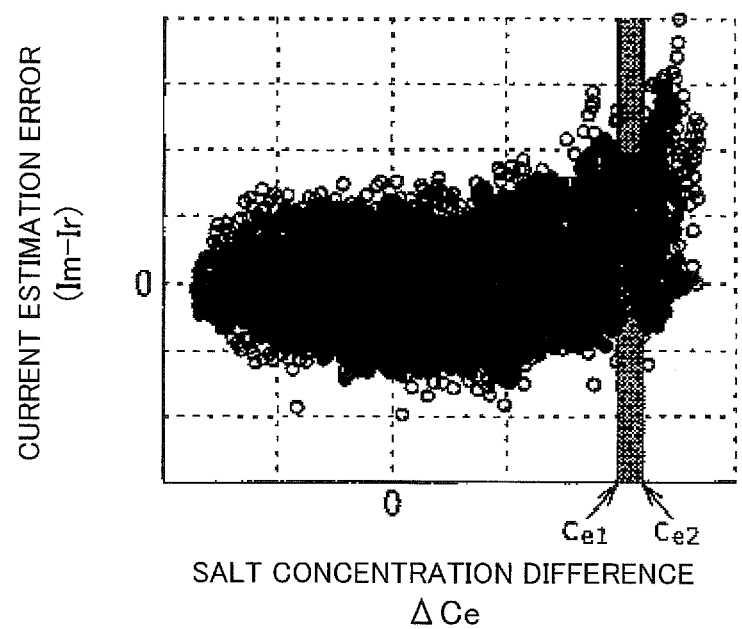
FIG. 13 is a diagram showing correlation between the salt concentration of the electrolytic solution between electrodes and a current estimation error.

FIG. 13 shows correlation between a salt concentration difference $\Delta c_e$ of electrolytic solution between the electrodes estimated in the expressions (31) and (32) and a current estimation error (Im−Ir) (Im represents the estimated current density and the Ir represents the measured current density). Referring to FIG. 13, the current estimation error tends to increase when the salt concentration difference $\Delta c_e$ increases.

Thus, the value of the current estimation error (Im−Ir) when the salt concentration difference $\Delta c_e$ is large can be used as the high-rate resistance increase amount. Conditions when the salt concentration difference $\Delta c_e$ is large include, for example, a condition that the value of the salt concentration difference $\Delta c_e$ is equal to or larger than a predetermined value or a condition that the value of the salt concentration difference $\Delta c_e$ falls within a predetermined range.

While the difference between the estimated current density Im and the measured current density Ir is used in the present embodiment, the present invention is not limited thereto, and a ratio between the estimated current density Im and the measured current density Ir may be used.

It is contemplated that the current estimation error (Im−Ir) is present in the region in which the salt concentration difference $\Delta c_e$ is large since the increase in the battery resistance resulting from the reduced salt concentration of the electrolytic solution within the electrode differs between the actual secondary battery 10 and the battery model. On the other hand, a voltage change amount ΔV caused by the increased battery resistance is equal between the actual secondary battery 10 and the battery model. Thus, when the actually produced increase in the battery resistance is represented by Rr and the increase in the battery resistance in the battery model is represented by Rm, an expression (33) holds.

$$\Delta V = R_m I_m = R_r I_r \quad (33)$$

In the present embodiment, an expression (34) is defined relating to the expression (33).

$$\Delta V(t1) = I_r(t1)R_r(t1) = I_m(t1)R_m(t1) = I_m(t0)R_m(t0) \quad (34)$$

ΔV(t1) represents a voltage drop amount of the secondary battery 10. Ir(t1) represents the current density obtained from the current Ib detected by the current sensor 21, and Rr(t1) represents the battery resistance when the detected current Ib is obtained. Im(t1) represents the current density I(t) estimated by the current estimating section 330, Rm(t1) represents the battery resistance obtained from the current density (t) estimated by the current estimating section 330. Im(t0) represents the current density when the high-rate resistance increase is eliminated by leaving the secondary battery 10 at rest, and Rm(t0) represents the battery resistance obtained from the current density Im(t0).

In the expression (34), the relationships in the following expression (35) hold.

$$R_r(t1) > R_m(t1) > R_m(t0)$$

$$I_r(t1) < I_m(t1) \leq I_m(t0) \quad (35)$$

In the expression (34), the battery resistance Rm(t1) may include the high-rate resistance increase amount, and the battery resistance Rm(t1) is higher than the battery resistance Rm(t0) when the high-rate resistance increase does not occur.

According to the expression (M1f), the expression (34) can be represented as an expression (36).

$$\Delta V(t1) = I_m(t1)R_m(t1) = I_m(t0)R_m(t0) \quad (36)$$

$$\Delta V(t1) = U(\theta, t1) - V(t1) = U(\theta, t0) - V(t0)$$

$$I(t1)Rd(T, t1) + I(t1)\frac{RT(t1)}{\alpha_a F}\frac{1}{2La_s i_o(\theta, T, t1)/g_r(t1)} =$$

-continued $$I(t0)Rd(T, t0) + I(t0)\frac{RT(t0)}{\alpha_a F}\frac{1}{2La_s i_o(\theta, T, t0)/g_r(t0)}$$

In the expression (36), a value (I×Rd) relating to the component having no influence on the high-rate resistance increase is omitted. A temperature T(t0) is assumed to be a temperature T(t1). With this assumption, the expression (36) is represented as an expression (37).

$$\frac{RT(t1)}{\alpha_a F}\frac{I(t1)}{2La_s i_o(\theta, T, t1)/g_r(t1)} = \frac{RT(t0)}{\alpha_a F}\frac{I(t0)}{2La_s i_o(\theta, T, t0)/g_r(t0)} \quad (37)$$

The expression (37) can be transformed into an expression (38).

$$\frac{I(t0)}{I(t1)} = \frac{g_r(t1)/g_r(t0)}{i_o(\theta, T, t1)/i_o(\theta, T, t0)} \approx \frac{g_r(t1)}{g_r(t0)} \quad (38)$$

According to the expression (38), resistance change rates gr(t1) and gr(t0) are calculated and a current density I(t1) is estimated by the current estimating section 330 to allow the estimation of a current density I(t0) when the high-rate resistance increase is not occurred.

The deterioration of the secondary battery 10 can be divided into a wear deterioration component (corresponding to a first deterioration component) and a high-rate deterioration component (corresponding to a second deterioration component). Thus, the high-rate resistance increase amount ΔRh corresponds to a difference between the battery resistance Rr due to the deterioration which includes the high-rate resistance increase and a battery resistance $R_{r0}$ due to the deterioration which does not include the high-rate resistance increase (wear deterioration) as shown in an expression (39).

$$\Delta R_h = R_r - R_{r0} \quad (39)$$

The both sides of the expression (39) can be multiplied by the battery current Ir to calculate a voltage drop amount ΔVhr due to the high-rate resistance increase as shown in an expression (40).

$$\Delta V_{hr} = \Delta R_r \times I_r = (R_r - R_{r0}) \times I_r \quad (40)$$

Assuming that the high-rate resistance increase has a slight and thus negligible influence on an estimated resistance Rm calculated from the estimated current density Im, the resistance Rr0 can be considered as the estimated resistance Rm. Thus, the expressions (39) and (40) are represented as expressions (41) and (42).

$$\Delta R_h = R_r - R_m \quad (41)$$

$$\Delta V_{hr} = (R_r - R_m) \times I_r \quad (42)$$

On the other hand, since the high-rate resistance increase can be observed as the error between the estimated current Im and the measured current Ir, a voltage drop amount ΔVhm associated with the high-rate resistance increase is represented as an expression (43).

$$\Delta V_{hm} = R_m I_m - R_m I_r = R_m \times \Delta I \quad (43)$$

In the expression (43), ΔI represents the current estimation error.

Assuming that the voltage drop amount ΔVhr as the measured value is equal to the voltage drop amount ΔVhm as the estimated value, an expression (44) is obtained from the expressions (41) to (43).

$$\Delta V_h = R_m \times I = \Delta R_h \times I_r \quad (44)$$

An expression (45) is obtained from the expression (44).

$$\Delta R_h = \frac{\Delta I}{I_r} R_m = \frac{\Delta I}{I_m} R_r \quad (45)$$

When the expression (34) is used, a high-rate resistance increase amount ΔRh(t1) can be represented as an expression (46).

$$\Delta Rh(t1) = R_r(t1) - R_m(t0) \quad (46)$$
$$= \left(\frac{I_m(t0)}{I_r(t1)} - 1\right) R_m(t0)$$
$$\approx \left(\frac{\xi I_m(t1)}{I_r(t1)} - 1\right) R_m(t0)$$

A correction coefficient ξ included in the expression (46) is represented by an expression (47).

$$\xi = \frac{I(t0)}{I(t1)} \approx \frac{g_r(t1)}{g_r(t0)} \quad (47)$$

According to the expression (47), the current density Im(t0) when the high-rate resistance increase does not occur can be calculated on the basis of the resistance change rates $g_r(t1)$ and $g_r(t0)$ and the current density Im(t1) estimated by the current estimating section 330. Once the current density Im(t0) is calculated, the battery resistance Rm(t0) can be calculated (estimated) on the basis of the expression (34). Specifically, the battery resistance Rm(t0) can be calculated by dividing the voltage drop amount ΔV(t1) by the current density Im(t0).

When the current density Im(t0) and the battery resistance Rm(t0) can be calculated, the high-rate resistance increase amount ΔRh(t1) can be calculated with the expression (46).

On the other hand, a high-rate resistance increase rate γ can be defined as shown in the following expression (48). The high-rate resistance increase rate γ can be used to evaluate the high-rate resistance increase.

$$\gamma = \frac{\xi I_m(t1)}{I_r(t1)} - 1 = \frac{\Delta R_h(t1)}{R_m(t0)} \quad (48)$$

In an example of the method of evaluating the high-rate resistance increase using the high-rate resistance increase rate γ, an allowable value γlim is set, and when the high-rate resistance increase rate γ is higher than the allowable value γlim, it can be determined that the high-rate resistance increase occurs. The allowable value γlim is set on the basis of the high-rate resistance increase amount ΔRh (t1) and the battery resistance Rm(t0) when the high-rate resistance increase does not occur. The battery resistance Rm(t0) corresponds to the resistance due to the wear deterioration. When the resistance due to the wear deterioration and the high-rate resistance increase amount ΔRh(t1) are previously determined in view of the life of the secondary battery 10, the allowable value γlim can be set.

When the high-rate resistance increase rate γ is higher than the allowable value γlim, it can be determined that the deterioration due to the high-rate resistance increase occurs. When the deterioration due to the high-rate resistance increase occurs, the input/output of the secondary battery 10 can be limited. In limiting the input/output of the secondary battery 10, at least one control parameter for the voltage, the current, and the electric power can be limited. Since the method of limiting the input/output is well known, detailed description thereof is omitted.

On the other hand, the determination of whether or not the high-rate resistance increase is eliminated can be made by setting an elimination value γa. The elimination value γa is a value lower than the allowable value γlim and can be predefined.

With the definition of the high-rate resistance increase rate γ as shown in the above expression (48), the high-rate resistance increase rate γ can be calculated only by obtaining the current densities Im(t1) and Ir(t1), so that the computing load can be reduced as compared with the calculation of the high-rate resistance increase amount ΔRh.

Figure 14:
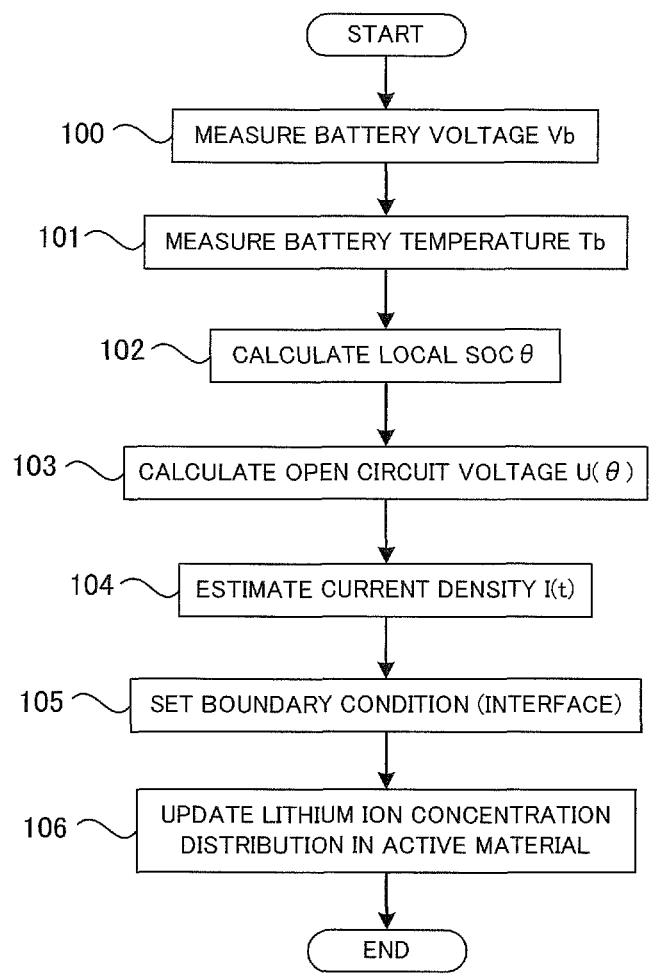
FIG. 14 is a flow chart for describing processing in a battery state estimating section.

Next, the processing of the battery state estimating section 300 is described with reference to a flow chart shown in FIG. 14. The processing shown in FIG. 14 is performed at predetermined intervals.

The battery state estimating section 300 obtains the battery voltage Vb based on the output from the voltage sensor 21 at step S100 and obtains the battery temperature Tb based on the output from the temperature sensor 23 at step S101.

At step S102, the battery state estimating section 300 (diffusion estimating section 310) calculates the local SOCθ based on the lithium concentration distribution in the previous computing with the expression (M2b). At step S103, the battery state estimating section 300 (the open circuit voltage estimating section 320) calculates the open circuit voltage U(θ) from the local SOCθ obtained at step S103.

At step S104, the battery state estimating section 300 (current estimating section 330) calculates (estimates) a current density Im(t) with the expression (M1f). The estimated current density Im(t) is obtained by substituting the battery voltage Vb, the open circuit voltage U(θ) obtained at step S103, and the parameter values set in the parameter setting section 340 into the expression (M3a).

Once the estimated current density Im(t) (identical to Im(t1)) is obtained, the estimated resistance Rm(t1) can be calculated with the expression (34). The resistance change rate calculating section 360 uses the current Ib detected by the current sensor 22 and the expression (30) to calculate the resistance change rate $g_r$. Specifically, in the expression (30), the value estimated by the open circuit voltage estimating section 320 can be used as the open circuit voltage U(θ) and the battery voltage Vb obtained from the voltage sensor 21 can be used as the voltage V(t). In addition, the map representing the relationship between the battery temperature Tb, the local SOCθ, and the DC resistance Ran can be used to specify the DC resistance Ran from the battery temperature Tb and the local SOCθ. The current density I(t) specified from the current Ib detected by the current sensor 22 can be used as the current density I(t).

At step S105, the battery state estimating section 300 (boundary condition setting section 350) calculates the reaction current density (lithium production amount) $j_j^{Li}$ from the estimated current density I(t) obtained at step S105. The battery state estimating section 300 (boundary condition setting section 350) also uses the calculated reaction current density to set the boundary condition (active material interface) at the active material interface in the expression (M2b).

At step S106, the battery state estimating section 300 (diffusion estimating section 310) uses the expression (M2b) to calculate the lithium ion concentration distribution within the active material model and updates the estimated value of the lithium ion concentration in each area. The lithium ion concentration (updated value) in the outermost divided area is used for calculating the local SOCθ at step S102 when the processing shown in FIG. 14 is performed next.

Figure 15:
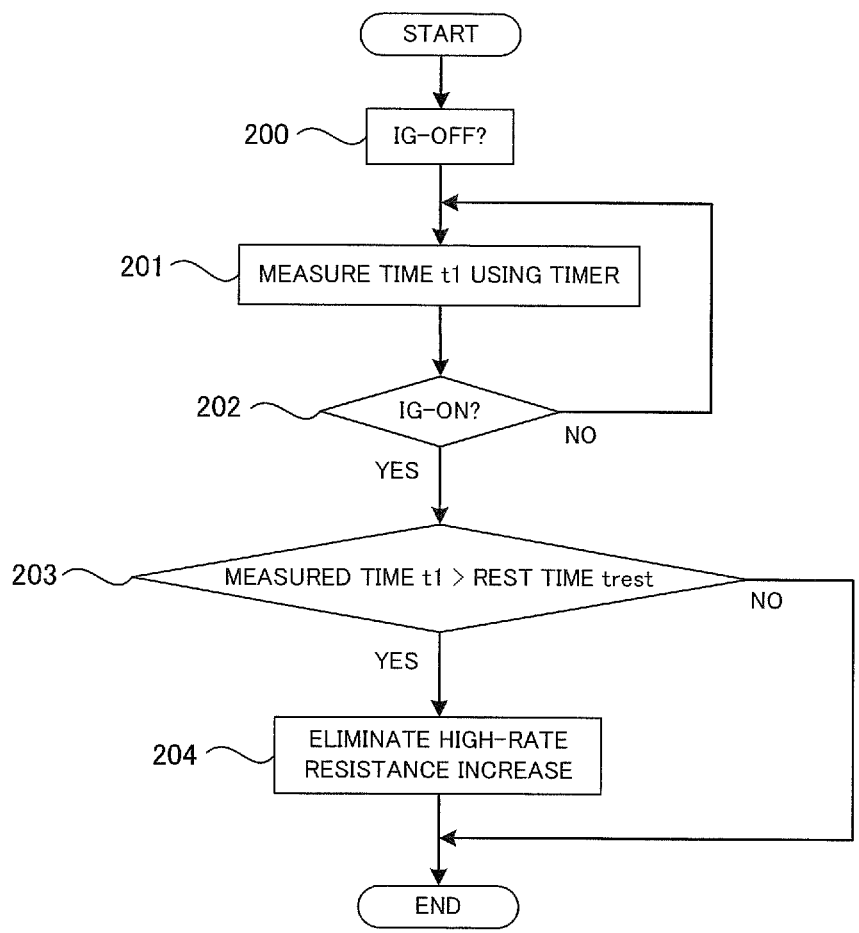
FIG. 15 is a flow chart for describing determination of elimination of a high-rate resistance increase.

Next, (part of) processing performed by the determining section 370 is described with reference to a flow chart shown in FIG. 15. The processing shown in FIG. 15 is the processing of determining whether or not the high-rate resistance increase is eliminated.

When the ignition switch is switched from ON to OFF at step S200, the determining section 370 performs processing at step S201. At step S201, the determining section 370 measures a time t1 using the timer 371. The measurement of the time t1 is performed from the timing of the switching of the ignition switch from ON to OFF to the timing of switching of the ignition switch from OFF to ON.

At step S202, the determining section 370 determines whether or not the ignition switch is switched from OFF to ON. When the ignition switch is not switched from OFF to ON, the processing at step S201 is continuously performed. When the ignition switch is switched from OFF to ON, the determining section 370 performs processing at step S203.

At step S203, the determining section 370 determines whether or not the measured time t1 provided at the processing of step S201 is longer than the rest time trest. The rest time trest is a time period to the elimination of the high-rate resistance increase and can be previously set. Since the high-rate resistance increase occurs due to an imbalance of lithium salt concentration, the time period in which the imbalance of lithium salt concentration is alleviated is previously determined with an experiment or the like and is used as the rest time trest. Information about the rest time trest can be previously stored in the memory, and the determining section 370 can obtain the information about the rest time trest from the memory.

When the measured time t1 is shorter than the rest time trest, the determining section 370 ends the processing. On the other hand, when the measured time t1 is longer than the rest time trest, the determining section 370 determines that the high-rate resistance increase is eliminated at step S204. When the determining section 370 determines the elimination of the high-rate resistance increase, learn processing of the resistance change rate $g_r$ is performed as described below.

Figure 16:
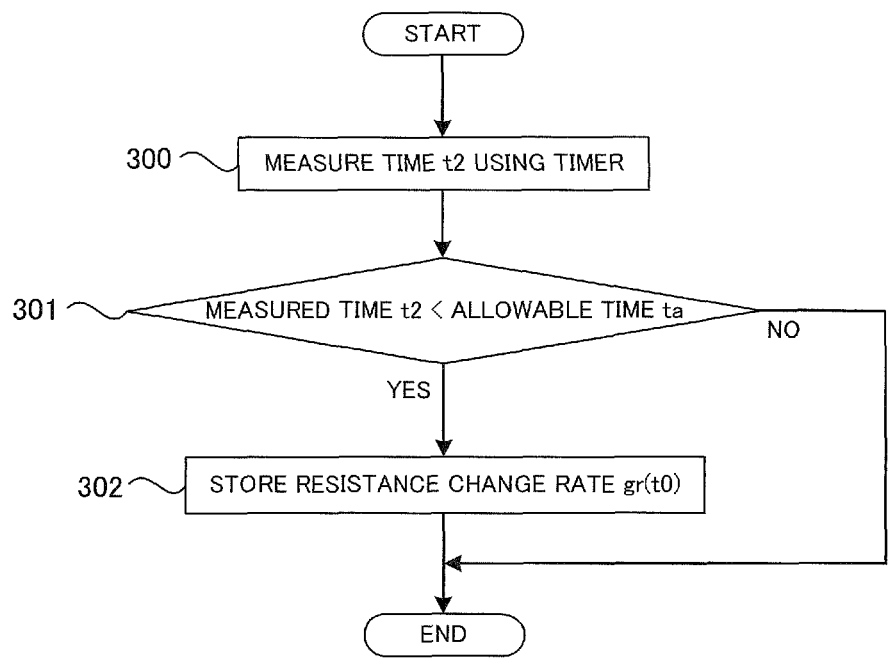
FIG. 16 is a flow chart for describing processing when the high-rate resistance increase is eliminated.

FIG. 16 is a flow chart for describing the learn processing of the resistance change rate $g_r$. The processing shown in FIG. 16 is performed by the determining section 370 when the ignition switch is switched from OFF to ON.

At step S300, the determining section 370 measures a time t2 using the timer 371 from the timing of the switching of the ignition switch from OFF to ON. At step S301, the determining section 370 determines whether or not the measured time t2 obtained at step S300 is longer than an allowable time ta. The allowable time ta refers to a time period for which the influence of the high-rate resistance increase is negligible and can be set previously. Since the high-rate resistance increase does not tend to occur in a time period immediately after the ignition switch is turned on, this time period is set as the allowable time ta. Information about the allowable time ta can be previously stored in the memory, and the determining section 370 can read the information about the allowable time ta from the memory.

When the measured time t2 is shorter than the allowable time ta, the determining section 370 stores a resistance change rate $g_r$ (corresponding to $g_r(t0)$) calculated by the resistance change rate calculating section 360 in the storage section 380 at step S302. The determining section 370 has obtained the resistance change rate $g_r$ from the resistance change rate calculating section 360, and stores the resistance change rate $g_r$ obtained from the resistance change rate calculating section 360 in the storage section 380 when the measured time t2 is shorter than the allowable time ta.

When the measured time t2 is longer than the allowable time ta, the determining section 370 does not store the resistance change rate in the storage section 380 but ends the processing. When the measured time t2 is longer than the allowable time ta, the resistance change rate $g_r$ calculated by the resistance change rate calculating section 360 is output to the resistance increase amount estimating section 390.

The resistance increase amount estimating section 390 substitutes the resistance change rate $g_r(t0)$ stored in the storage section 380 and the resistance change rate $g_r(t1)$ obtained from the resistance change rate calculating section 360 into the expression (47) to calculate the correction coefficient $\xi$. The resistance increase amount estimating section 390 also uses the expression (47) to calculate the estimated current density Im(t0) from the correction coefficient $\xi$ and the estimated current density Im(t1). Once the estimated current density Im(t0) is calculated, the estimated resistance Rm(t0) can be calculated from the expression (34).

The resistance increase amount estimating section 390 uses the expression (46) to calculate the high-rate resistance increase amount ΔRh (t1). Specifically, the high-rate resistance increase amount ΔRh (t1) can be calculated by substituting the measured current density Ir(t1), the estimated current density Im(t1), the correction coefficient $\xi$, and the estimated resistance Rm(t0) into the expression (46).

Figure 17:
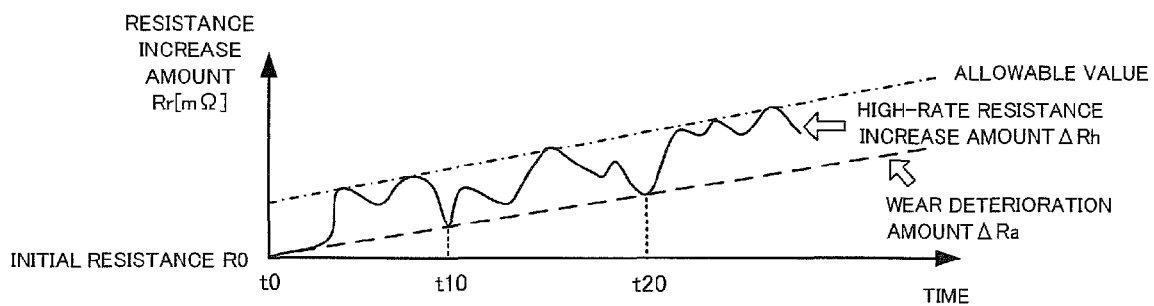
FIG. 17 is a graph showing a relationship between a high-rate resistance increase amount and a wear deterioration amount.

FIG. 17 is a graph showing a (exemplary) relationship between the use time of the secondary battery 10 and the resistance increase amount Rr [mΩ] associated with the use of the secondary battery 10. The secondary battery 10 has an initial resistance R0, and a wear deterioration amount ΔRa increases with charge and discharge of the secondary battery 10. The high-rate resistance increase amount ΔRh also changes with charge and discharge of the secondary battery 10. The resistance increase amount Rr of the secondary battery 10 is the sum of the wear deterioration amount ΔRa and the high-rate resistance increase amount ΔRh. When the resistance increase amount Rr reaches an allowable value, the input/output of the secondary battery 10 can be limited.

In FIG. 17, the secondary battery 10 is in the initial state (the state immediately after the manufacture) at a timing t0. When the secondary battery 10 is in the initial state, the high-rate resistance increase does not occur, and the resistance increase amount Rr of the secondary battery 10 includes only the initial resistance R0. At timings t10 and t20, the high-rate resistance increase is eliminated, and the resistance increase amount Rr of the secondary battery 10 includes only the wear deterioration amount ΔRa.

Figure 18:
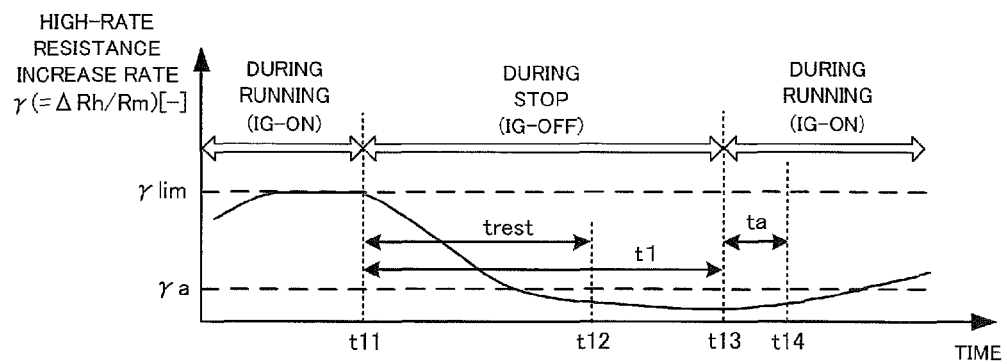
FIG. 18 is a graph showing (exemplary) changes in a high-rate resistance increase rate.

FIG. 18 is a graph showing a (exemplary) relationship between the high-rate resistance increase rate γ and the use time of the secondary battery 10. As described with the expression (48), the high-rate resistance increase can be evaluated by the calculation of the high-rate resistance increase rate γ. Specifically, as shown in FIG. 18, when the high-rate resistance increase rate γ is higher than the allowable value γlim, it can be determined that the deterioration occurs due to the high-rate resistance increase. On the other hand, when the high-rate resistance increase rate γ is lower than a threshold value γa, it can be determined that the high-rate resistance increase is eliminated.

In FIG. 18, the ignition switch is ON and charge and discharge of the secondary battery 10 are performed in accordance with running of the vehicle until a timing t11. The high-rate resistance increase rate γ increases with the charge and discharge of the secondary battery 10.

When the ignition switch is switched from ON to OFF at the timing t11, the charge and discharge of the secondary battery 10 are not performed, and thus the high-rate resistance increase reduces. In other words, the high-rate resistance increase rate γ reduces over time. The determining section 370 measures the time t1 using the timer 371 from the timing t11. At a timing t12 when the rest time trest has elapsed, the high-rate resistance increase rate γ is lower than the threshold value γa.

At a timing t13, the ignition switch is switched from OFF to ON. The measured time t1 using the timer 371 is the time from the timing t11 to the timing t13. In the example shown in FIG. 18, the measured time t1 is longer than the rest time trest, and the determining section 370 determines that the high-rate resistance increase is eliminated.

At the timing t13, the determining section 370 measures the time t2 using the timer 371. During the time in which the measured time t2 is shorter than the allowable time ta, that is, during the time from the timing t13 to a timing t14, the resistance change rate $g_r$ calculated by the resistance change rate calculating section 360 is stored in the storage section 380 as described above.

Figure 19:
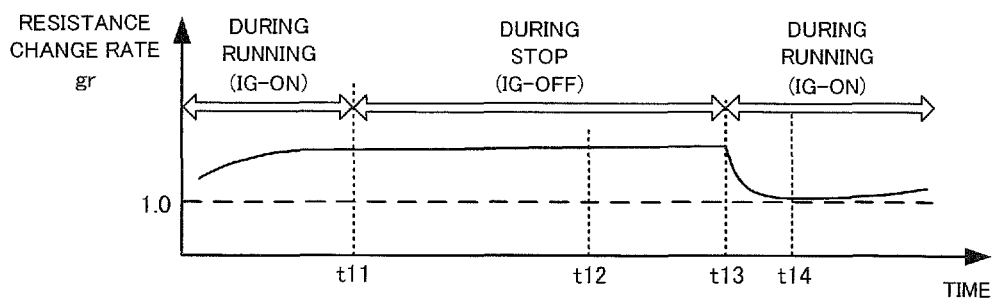
FIG. 19 is a graph showing (exemplary) changes in a resistance change rate.

FIG. 19 is a graph showing a (exemplary) relationship between the resistance change rate $g_r$ and the use time of the secondary battery 10. Timings t11 to t14 shown in FIG. 19 correspond to the timings t11 to t14 shown in FIG. 18.

In FIG. 19, the ignition switch is ON and the resistance change rate $g_r$ increases with the use of the secondary battery 10 until the timing t11. When the ignition switch is switched from ON to OFF at the timing t11, the resistance change rate $g_r$ is not calculated, so that the resistance change rate $g_r$ is maintained at the resistance change rate $g_r$ calculated at the timing t11. The actual resistance change rate $g_r$ of the secondary battery 10 reduces over time.

When the ignition switch is switched from OFF to ON at the timing t13, the resistance change rate $g_r$ is calculated. The determining section 370 measures the time t2 from the timing t13. During the time before the measured time t2 reaches the allowable time ta, that is, during the time period from the timing t13 to the timing t14, the calculated resistance change rate $g_r$ is stored in the storage section 380. Since the calculation of the resistance change rate $g_r$ is performed at predetermined intervals, the resistance change rate $g_r$ stored in the storage section 380 is updated at predetermined intervals. In other words, the resistance change rate $g_r$ stored in the storage section 380 reduces as shown in FIG. 19.

After the timing t14, the storage of the resistance change rate $g_r$ in the storage section 380 is prohibited. After the timing t14, the resistance increase amount estimating section 390 calculates the high-rate resistance increase amount ΔRh using the resistance change rate $g_r(t0)$ stored in the storage section 380 and the resistance change rate $g_r(t1)$ calculated by the resistance change rate calculating section 360.

When the secondary battery 10 is in the initial state as shown in FIG. 17, the high-rate resistance increase does not occur, and thus the resistance change rate $g_r$ can be calculated and the calculation result can be stored in the storage section 380. This allows the calculation of the high-rate resistance increase amount ΔRh from the time when the use of the secondary battery 10 is started.

According to the present embodiment, the high-rate resistance increase amount ΔRh included in the resistance increase amount Rr of the secondary battery 10 can be specified through the use of the expression (46). According to the expression (41) or the expression (46), the battery resistance Rm when the high-rate resistance increase does not occur is used, but there is a possibility that the battery resistance Rm may include the high-rate resistance increase amount.

To address this, in the present embodiment, the correction coefficient ξ can be used to specify the current density Im(t0) and the resistance Rm(t0) when the high-rate resistance increase does not occur, so that the accuracy of the estimation of the high-rate resistance increase amount ΔRh can be improved. Specifically, the ratio (correction coefficient between the resistance change rate $g_r$ when the high-rate resistance increase does not occur and the resistance change rate $g_r$ when the high-rate resistance increase occurs can be used to transform the current density Im(t1) and the battery resistance Rm(t1) into the current density Im(t0) and the battery resistance Rm(t0) when the high-rate resistance increase does not occur.

While Im is the estimated current density and Ir is the measured current density in the present embodiment, the present invention is not limited thereto. A current value obtained by multiplying the estimated current density by an electrode surface area may be set as Im, and the measured current value may be set as Ir.

While the correction coefficient ξ is calculated by using the resistance change rates $g_r$(t1) and $g_r$(t0) in the present embodiment, the present invention is not limited thereto. As shown in an expression (49), the correction coefficient ξ can be calculated by using the resistance change rate and a capacity retention rate. Since the high-rate resistance increase may depend more on the resistance change rate than on the capacity retention rate, the correction coefficient ξ can be calculated by using only the resistance change rate as in the present embodiment.

$$\xi = \frac{I(t0)}{I(t1)} \approx \frac{g_r(t1)/g_r(t0)}{k(t1)/k(t0)} \quad (49)$$

The capacity retention rate is a value provided by dividing the capacitance of a single electrode in a deterioration state by the capacitance of a single electrode in the initial state. When the secondary battery is deteriorated, the capacitance of the single electrode becomes lower than the capacitance in the initial state.

A capacitance retention rate k1 of the positive electrode is represented by an expression (50).

$$k_1 = \frac{Q_{1\_ini} - \Delta Q_1}{Q_{1\_ini}} \quad (50)$$

Q1_ini represents the capacitance of the positive electrode 15 when the secondary battery 10 is in the initial state and can be previously specified through an experiment or the like. ΔQ1 is a reduction amount of the capacitance of the positive electrode in association with the deterioration. The capacitance retention rate k1 can be calculated by comparing a fully charged capacitance after the deterioration with a fully charged capacitance in the initial state.

A capacitance retention rate k2 of the negative electrode is represented by an expression (51).

$$k_2 = \frac{Q_{2\_ini} - \Delta Q_2}{Q_{2\_ini}} \quad (51)$$

Q2_ini represents the capacitance of the negative electrode 12 when the secondary battery 10 is in the initial state and can be previously specified through an experiment or the like. ΔQ2 is a reduction amount of the capacitance of the negative electrode in association with the deterioration. The capacitance retention rate k2 can be calculated by comparing a fully charged capacitance after the deterioration with a fully charged capacitance in the initial state.

For the capacitance retention rate k shown in the expression (49), the capacitance retention rate of at least one of the positive electrode 15 and the negative electrode 12 can be considered.

While it is determined that the high-rate resistance increase is eliminated when the measured time t1 is longer than the rest time trest in the present embodiment, the present invention is not limited thereto. For example, it can be determined whether or not the high-rate resistance increase is eliminated on the basis of the high-rate resistance increase amount ΔRh or the amount of the lithium salt concentration imbalance. In the determination of the elimination of the high-rate resistance increase, at least one parameter of the measured time t1, the high-rate resistance increase amount ΔRh, and the amount of the lithium salt concentration imbalance can be used.

Figure 20:
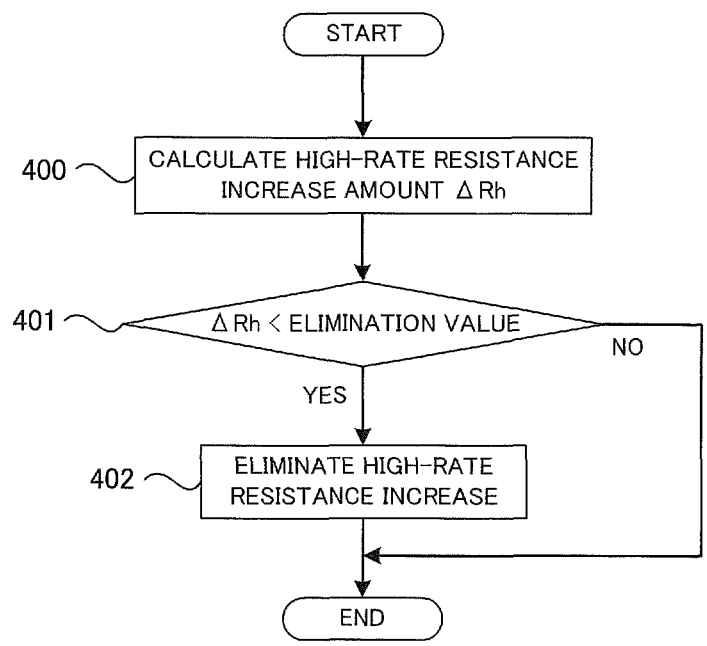
FIG. 20 is a flow chart for describing determination of elimination of the high-rate resistance increase in a variation of an embodiment 1.

FIG. 20 is a flow chart showing the processing of determining the elimination of the high-rate resistance increase based on the high-rate resistance increase amount ΔRh. The processing shown in FIG. 20 is performed by the controller 30.

At step S400, the resistance increase amount estimating section 390 calculates the high-rate resistance increase amount ΔRh as described in the present embodiment. The resistance increase amount estimating section 390 outputs information about the calculated high-rate resistance increase amount ΔRh to the determining section 370.

At step S410, the determining section 370 determines whether or not the high-rate resistance increase amount ΔRh is smaller than the elimination value. The elimination value is a value at which it can be determined that the high-rate resistance increase is eliminated, and can be previously set. Information about the elimination value can be stored in the memory, and the determining section 370 reads the information about the elimination value from the memory.

When the high-rate resistance increase amount ΔRh is smaller than the elimination value, the determining section 370 determines that the high-rate resistance increase is eliminated at step S402. When the determining section 370 determines that the high-rate resistance increase is eliminated, the resistance change rate $g_r$ is stored in the storage section 380 as described in the present embodiment. When the high-rate resistance increase amount ΔRh is larger than the elimination value, the determining section 370 determines that the high-rate resistance increase is not eliminated, and ends the processing.

Figure 21:
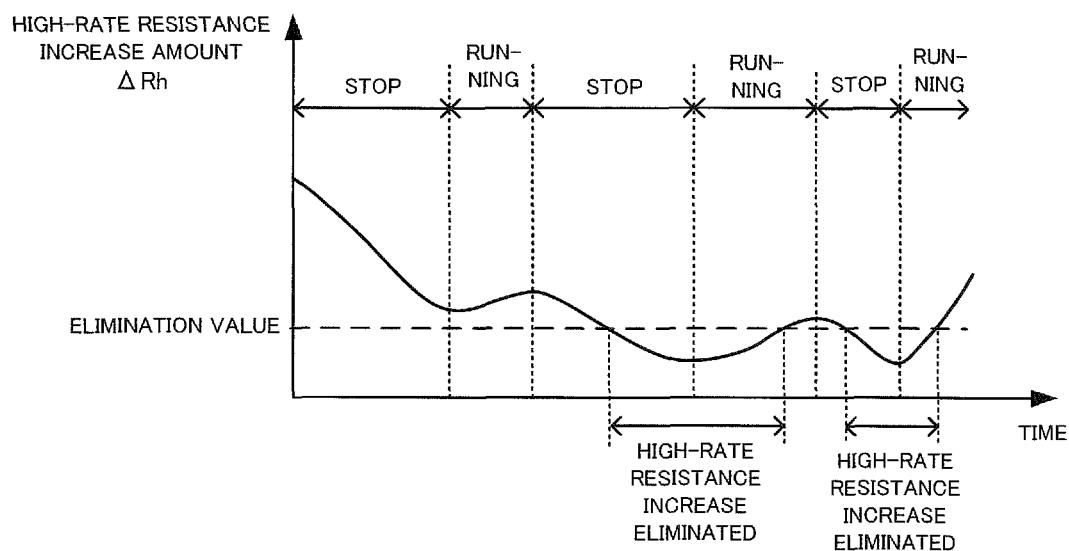
FIG. 21 is a graph showing (exemplary) changes in the high-rate resistance increase amount.

According to the processing shown in FIG. 20, it can be determined whether or not the high-rate resistance increase is eliminated even when the measured time t1 is shorter than the rest time trest. For example, when running and stop of the vehicle are frequently repeated as shown in FIG. 21, the amount of diffusion of the lithium salt concentration may be greater than the amount of imbalance of the lithium salt concentration. In this case, the high-rate resistance increase is eliminated even when the measured time t1 is shorter than the rest time trest. Thus, it can be determined that the high-rate resistance increase is eliminated by monitoring the high-rate resistance increase amount ΔRh.

While it is determined that the high-rate resistance increase is eliminated when the high-rate resistance increase amount ΔRh is smaller than the elimination value in the processing shown in FIG. 20, the present invention is not limited thereto. For example, when the high-rate resistance increase amount ΔRh continues to be smaller than the elimination value, it can be determined that the high-rate resistance increase is eliminated. For example, the number of times the high-rate resistance increase amount ΔRh is smaller than the elimination value is counted, and the count value reaches a predetermined value, it can be determined that the high-rate resistance increase is eliminated.

Figure 22:
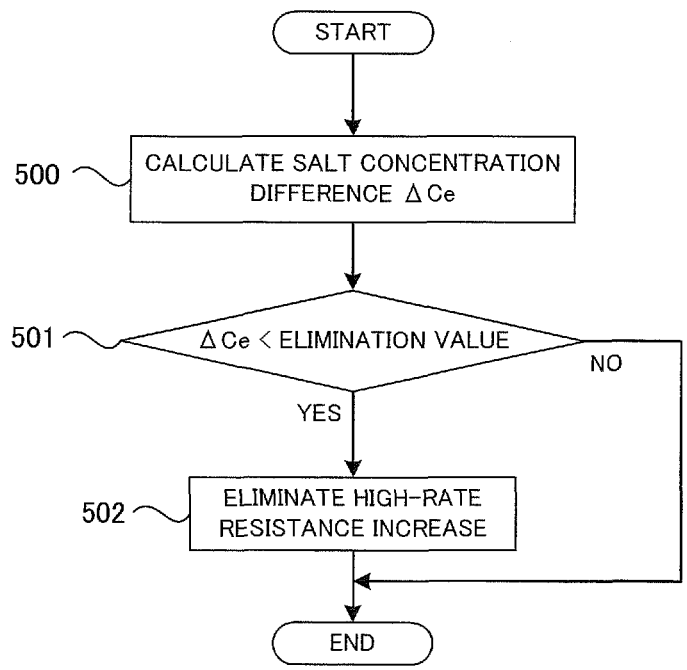
FIG. 22 is a flow chart for describing determination of elimination of the high-rate resistance increase in another variation of the embodiment 1.

FIG. 22 is a flow chart showing the processing of determining that the high-rate resistance increase is eliminated on the basis of the amount of the lithium ion concentration imbalance. The processing shown in FIG. 22 is performed by the controller 30. The amount of the lithium ion concentration imbalance can be specified by the salt concentration difference ΔCe shown in the expression (31).

At step S500, the determining section 370 calculates the salt concentration difference ΔCe based on the expression (31). At step S501, the determining section 370 determines whether or not the salt concentration difference ΔCe is smaller than the elimination value. The elimination value is the value at which it can be determined that the high-rate resistance increase is eliminated, and can be previously set. Information about the elimination value can be stored in the memory, and the determining section 370 reads the information about the elimination value from the memory.

When the salt concentration difference ΔCe is smaller than the elimination value, the determining section 370 determines that the high-rate resistance increase is eliminated at step S502. When the determining section 370 determines that the high-rate resistance increase is eliminated, the resistance change rate $g_r$ is stored in the storage section 380 as described in the present embodiment. When the salt concentration difference ΔCe is larger than the elimination value, the determining section 370 determines that the high-rate resistance increase is not eliminated, and ends the processing.

Figure 23:
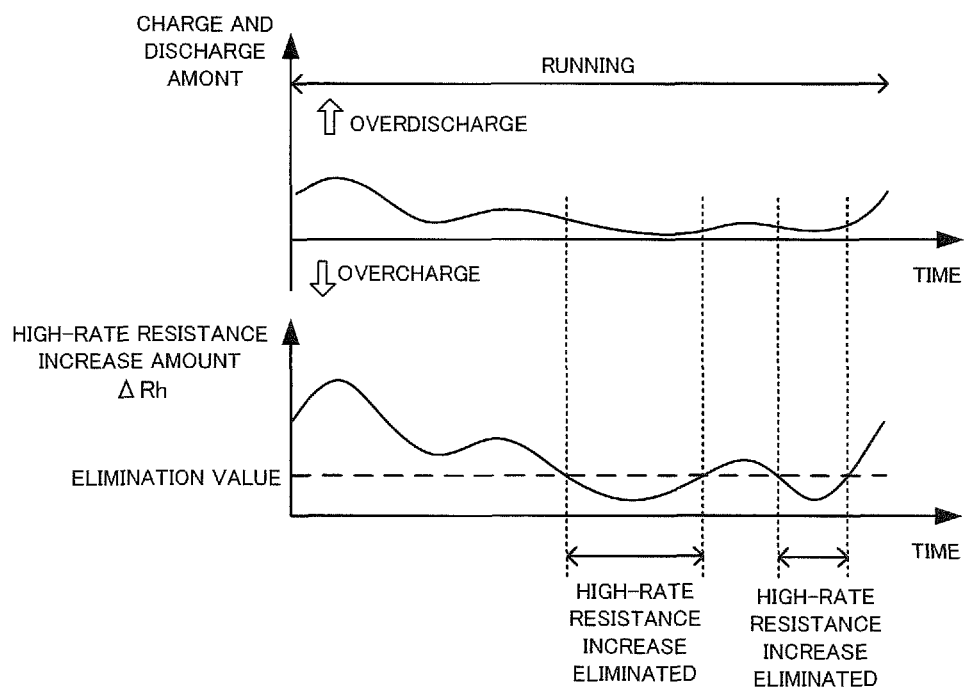
FIG. 23 is a graph showing (exemplary) changes in the high-rate resistance increase amount.

According to the processing shown in FIG. 22, it can be determined whether or not the high-rate resistance increase is eliminated even when the measured time t1 is shorter than the rest time trest. For example, as shown in FIG. 23, an imbalance of lithium ion concentration may be eliminated depending on the balance between charge and discharge amounts of the secondary battery 10 even when the vehicle continues to run. In this case, even when the measured time t1 is shorter than the rest time trest, the high-rate resistance increase is eliminated. Thus, it can be determined that the high-rate resistance increase is eliminated by monitoring the salt concentration difference ΔCe. FIG. 23 shows charge and discharge amounts and the high-rate resistance increase amount ΔRh on the vertical axis.

The basic battery model described above is configured on the assumption that the reaction in the thickness direction of the electrodes 12 and 15 is uniform and the assumption that the concentrations of lithium ions Li+ in the electrodes 12 and 15 are constant. Instead of the basic battery model, a battery model in view of the overvoltage $\Delta\phi_e(t)$ due to the difference in the lithium ion concentration between the electrodes 12 and 15 can be used.

In the expression (9), it is assumed that the voltage drop due to the DC resistance is independent of the overvoltage due to the difference in the lithium ion concentration. In this case, as shown in an expression (52), a relationship between the overvoltage $\Delta\phi_{ej}(x, t)$ due to the difference in the lithium ion concentration between the electrodes 12 and 15 and the difference $\Delta C_{ej}(x, t)$ in the lithium ion concentration between the electrodes 12 and 15 is obtained.

$$k_j^{eff} \Delta\phi_e + k_{Dj}^{eff} \Delta \ln C_e = 0 \tag{52}$$

$$\Delta\phi_e = -k_e \Delta \ln C_e = -\frac{2RT}{F}(t_+^0 - 1)\Delta \ln C_e$$

$$k_e = \frac{2RT}{F}(t_+^0 - 1)$$

When the overvoltage $\Delta\phi_e(t)$ is calculated from the expression (52), an expression (53) is obtained.

$$\Delta\phi_e(t) = -k\Delta\ln C_e(t) = -k\ln\frac{C_{e1}(t)}{C_{e2}(t)} = -k\ln\frac{C_{e,ini} - \Delta C_e(t)}{C_{e,ini} + \Delta C_e(t)} \tag{53}$$

$$(C_{e,ini} \gg \Delta C_e(t))$$

In the expression (53), $C_{e,ini}$ represents the concentration of lithium ions when the secondary battery 10 is in the initial state.

When the expression (53) is linearly approximated, an expression (54) is obtained.

$$\Delta\phi_e(t) = -k\ln\frac{C_{e,ini} - \Delta C_e(t)}{C_{e,ini} + \Delta C_e(t)} \approx -2k\frac{\Delta C_e(t)}{C_{e,ini}} = -\frac{4RT}{F}(t_+^0 - 1)\frac{\Delta C_e(t)}{C_{e,ini}} \tag{54}$$

The concentration difference shown in the expression (54) can be calculated from the expression (31) and the expression (32) and can be represented by an expression (31'a) and an expression (32').

$$\Delta C_e(t + \Delta t) = \Delta C_e(t) - \alpha_e \Delta C_e(t) + \beta_e I(t + \Delta t) \tag{31'a}$$

$$\alpha_e = \frac{2\Delta t D_{eff}(T)}{\varepsilon_e L \Delta x}, \quad \beta_e = \frac{1 - t_+^0}{F}\frac{\Delta t}{\varepsilon_e L} \tag{32'}$$

Since the expression (31° a) is an expression relating to the difference in the lithium ion concentration between the electrodes 12 and 15, coefficients $\alpha_e$ and $\beta_e$ different from coefficients $\alpha$ and $\beta$ shown in the expression (32) are defined as shown in the expression (32').

When n time passages Δt have elapsed, the expression (31'a) can be represented by an expression (31'b).

$$\Delta C_e((n+1)\Delta t) = \beta_e \sum_{i=0}^{n}(1-\alpha_e)^{n-i}I((i+1)\Delta t) \tag{31'b}$$

When the concentration difference $\Delta C_e$ shown in the expression (31'b) is substituted into the expression (54), the overvoltage $\Delta\phi_e(t)$ can be determined.

On the other hand, when the overvoltage $\Delta\phi_e(t)$ is considered in the expression (M1b), it can be represented by an expression (M1g).

$$V(t) = U(\theta, t) + \Delta\phi_e(t) + \frac{RT}{\alpha_a F}\mathrm{arcsinh}\left(\frac{-I(t)}{2La_s i_0(\theta, T, t)}\right) - I(t)Rd(T) \quad (M1g)$$

$$Rd(T) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

Similarly, when the overvoltage $\Delta\phi_e(t)$ is considered in the expression (M1e), it can be represented by an expression (M1h).

$$V(t) = U(\theta, t) + \Delta\phi_e(t) + \frac{RT}{\alpha_a F}\mathrm{arcsinh}\left(\frac{-I(t) \times g_r}{2La_s i_0(\theta, T, t)}\right) - I(t)Rd(T) \quad (M1h)$$

When the expression (M1h) is linearly approximated, an expression (M1i) is obtained.

$$V(t) = U(\theta, t) + \Delta\phi_e(t) - \frac{RT}{\alpha_a F}\frac{I(t) \times g_r}{2La_s i_0(\theta, T, t)} - I(t)Rd(T) \quad (M1i)$$

In the battery model in view of the overvoltage $\Delta\phi_e(t)$, the expression (M1i) can be used to calculate the current density I(t). Specifically, in the process of calculating the current density I(t) with the expression (M1f), the overvoltage $\Delta\phi_e(t)$ calculated from the expression (54) and the expression (31'b) may be considered.

In the battery model in view of the overvoltage $\Delta\phi_e(t)$, the correction coefficient ξ can be determined as follows.

When the voltage drop amounts $\Delta V(t0)$ and $\Delta V(t1)$ at times t0 and t1, respectively, are determined with the expression (M1i), they are represented by an expression (55) and an expression (56). The time t0 is the time at which the high-rate resistance increase is eliminated, and the time t1 is the time at which the current value or the like is detected.

$$\Delta V(t1) = U(\theta, t1) - V(t1) + \Delta\phi_e(t1) = I(t1)\{Rr(\theta, T, t1) + Rd(T, t1)\} \quad (55)$$

$$\Delta V(t0) = U(\theta, t0) - V(t0) + \Delta\phi_e(t0) = I(t0)\{Rr(\theta, T, t0) + Rd(T, t0)\} \quad (56)$$

$$Rr(\theta, T, t) = \frac{RT(t)}{\alpha_a F}\frac{g_r(\theta, T, t)}{2La_s i_0(\theta, T, t)}$$

$$Rd(T, t) = \left(\frac{L_1}{3\kappa_1^{eff}} + \frac{L_s}{3\kappa_s^{eff}} + \frac{L_2}{3\kappa_2^{eff}} + \frac{L_1}{3\sigma_1^{eff}} + \frac{L_2}{3\sigma_2^{eff}}\right)$$

The correction coefficient ξ can be represented by an expression (57) using the expression (55), the expression (56), and the expression (47).

$$\xi = \frac{I(t0)}{I(t1)} \quad (57)$$

$$= \frac{U(\theta, t0) - V(t0) + \Delta\phi_e(t0)}{U(\theta, t1) - V(t1) + \Delta\phi_e(t1)} \cdot \frac{\frac{RT(t1)}{\alpha_a F}\frac{g_r(\theta, T, t1)}{2La_s i_0(\theta, T, t1)} + Rd(T, t1)}{\frac{RT(t0)}{\alpha_a F}\frac{g_r(\theta, T, t0)}{2La_s i_0(\theta, T, t0)} + Rd(T, t0)}$$

The correction coefficient ξ can be represented by an expression (58) using the resistance change rate gr and the capacitance retention rate k.

$$\xi = \frac{I(t0)}{I(t1)} \quad (58)$$

$$= \frac{U(\theta, t0) - V(t0) + \Delta\phi_e(t0)}{U(\theta, t1) - V(t1) + \Delta\phi_e(t1)} \cdot \frac{\frac{RT(t1)}{\alpha_a F}\frac{g_r(\theta, T, t1)/k(\theta, T, t1)}{2La_s i_0(\theta, T, t1)} + Rd(T, t1)}{\frac{RT(t0)}{\alpha_a F}\frac{g_r(\theta, T, t0)/k(\theta, T, t0)}{2La_s i_0(\theta, T, t0)} + Rd(T, t0)}$$

The expression (57) and the expression (58) have a relationship shown in an expression (59).

$$\xi = \frac{I(t0)}{I(t1)} = \frac{\Delta V(t0)}{\Delta V(t1)}\frac{R_m(T, t1)}{R_m(T, t0)} \quad (59)$$

The correction coefficient ξ can be calculated on the basis of the expression (57) and the expression (58). However, the calculation of the correction coefficient ξ can be simplified by setting some of the parameters shown in the expression (57) and the expression (58) as assumed values. For example, it can be assumed that the temperature T(t0) is equal to the temperature T(t1) or it can be assumed that the DC pure resistance Rd(T,t0) is equal to the DC pure resistance Rd(T,t1). In addition, it can be assumed that the exchange current density $i_0(\theta, T, t0)$ is equal to the exchange current density $i_0(\theta, T, t1)$ or it can be assumed that the overvoltage $\Delta\phi_e(t0)$ is equal to the overvoltage $\Delta\phi_e(t1)$.

The invention claimed is:

1. An estimation apparatus of estimating a deterioration state of a secondary battery, comprising:
   a current sensor measuring an electric current of the secondary battery;
   a current estimating section estimating the electric current of the secondary battery by using a battery model; and
   a deterioration estimating section estimating a second deterioration component produced in association with a salt concentration imbalance in the secondary battery by using the measured current obtained from the current sensor, the estimated current obtained from the current estimating section, and a first deterioration component produced in association with wear of the secondary battery,
   wherein the deterioration estimating section corrects the estimated current by using a ratio between a resistance change rate of the secondary battery when the second deterioration component is eliminated and a resistance change rate during charge and discharge of the secondary battery.

2. The estimation apparatus according to claim 1, further comprising a determining section determining that the second deterioration component is eliminated when a time for which charge and discharge of the secondary battery are prohibited is longer than a threshold value.

3. The estimation apparatus according to claim 1, further comprising a determining section determining that the second deterioration component is eliminated when the second deterioration component is less than a threshold value.

4. The estimation apparatus according to claim 1, further comprising a determining section determining that the second deterioration component is eliminated when an amount of the salt concentration imbalance is less than a threshold value.

5. The estimation apparatus according to claim 1, wherein the deterioration estimating section calculates the second deterioration component by using the following expression (I):

$$\Delta R_h = \left(\frac{\xi I_m}{I_r} - 1\right) R_m \quad (I)$$

where ΔRh represents the second deterioration component, ξ represents a correction coefficient including the resistance change rate, Im represents the estimated current, Ir represents the measured current, and Rm represents the first deterioration component.

6. The estimation apparatus according to claim 1, wherein the deterioration estimating section corrects the estimated current by using the ratio between the resistance change rates and a ratio between a capacitance retention rate when the second deterioration component is eliminated and a capacitance retention rate when charge and discharge of the secondary battery are performed.

7. An estimation method of estimating a deterioration state of a secondary battery, comprising:
   measuring an electric current of the secondary battery;
   estimating the electric current of the secondary battery by using a battery model; and
   estimating a second deterioration component produced in association with a salt concentration imbalance in the secondary battery by using the measured current, the estimated current, and a first deterioration component produced in association with wear of the secondary battery,
   wherein the estimated current is corrected by using a ratio between a resistance change rate of the secondary battery when the second deterioration component is eliminated and a resistance change rate during charge and discharge of the secondary battery in estimating the second deterioration component.

8. The estimation method according to claim 7, further comprising determining that the second deterioration component is eliminated when a time for which charge and discharge of the secondary battery are prohibited is longer than a threshold value.

9. The estimation method according to claim 7, further comprising determining that the second deterioration component is eliminated when the second deterioration component is less than a threshold value.

10. The estimation method according to claim 7, further comprising determining that the second deterioration component is eliminated when an amount of the salt concentration imbalance is less than a threshold value.

11. The estimation method according to claim 7, wherein the second deterioration component is calculated by using the following expression (II):

$$\Delta R_h = \left(\frac{\xi I_m}{I_r} - 1\right) R_m \quad (II)$$

where ΔRh represents the second deterioration component, ξ represents a correction coefficient including the resistance change rate, Im represents the estimated current, Ir represents the measured current, and Rm represents the first deterioration component.

12. The estimation method according to claim 7, wherein the estimated current is corrected by using the ratio between the resistance change rates and a ratio between a capacitance retention rate when the second deterioration component is eliminated and a capacitance retention rate when charge and discharge of the secondary battery are performed in estimating the second deterioration component.

* * * * *